United States Patent
Ohashi et al.

(10) Patent No.: US 12,342,583 B2
(45) Date of Patent: Jun. 24, 2025

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Teruyuki Ohashi, Kawasaki (JP); Hiroshi Kono, Himeji (JP); Shunsuke Asaba, Himeji (JP); Takahiro Ogata, Kobe (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 486 days.

(21) Appl. No.: 17/822,949

(22) Filed: Aug. 29, 2022

(65) Prior Publication Data

US 2023/0163166 A1    May 25, 2023

(30) Foreign Application Priority Data

Nov. 24, 2021    (JP) .................. 2021-190279

(51) Int. Cl.
  *H10D 62/10*    (2025.01)
  *H02P 27/06*    (2006.01)
  (Continued)

(52) U.S. Cl.
  CPC ........... *H10D 62/106* (2025.01); *H02P 27/06* (2013.01); *H10D 62/157* (2025.01); *H10D 62/8325* (2025.01)

(58) Field of Classification Search
  CPC ............... H10D 62/106; H10D 62/157; H10D 62/8325; H02P 27/06
  (Continued)

(56) References Cited

U.S. PATENT DOCUMENTS 9,246,016 B1    1/2016  Yen et al.
9,786,778 B1   10/2017  Morizuka
  (Continued)

FOREIGN PATENT DOCUMENTS

JP    2019-169487    10/2019
JP    2020-4956      1/2020
  (Continued)

OTHER PUBLICATIONS

Office Action mailed Feb. 18, 2025, in Japanese Application No. 2021-190279 filed Nov. 24, 20206/1 (w/computer-generated English translation).

*Primary Examiner* — Igwe U Anya
(74) *Attorney, Agent, or Firm* — Oblon, McClelland, Maier & Neustadt, L.L.P.

(57) ABSTRACT

A semiconductor device of an embodiment includes a transistor region and a diode region. The transistor region includes an n-type first silicon carbide region having a first portion in contact with a first plane, a p-type second silicon carbide region, an n-type third silicon carbide region, a first electrode in contact with the first portion, the second silicon carbide region, and the third silicon carbide region, a second electrode in contact with a second plane, and a gate electrode. The diode region includes an n-type first silicon carbide region having a second portion in contact with the first plane, a p-type fourth silicon carbide region, a first electrode in contact with the second portion and the fourth silicon carbide region, and a second electrode. An occupied area per unit area of the fourth silicon carbide region is larger than an occupied area per unit area of the second silicon carbide region. The first diode region is provided between a first transistor region and a second transistor region.

17 Claims, 21 Drawing Sheets

(51) Int. Cl.
*H10D 62/13* (2025.01)
*H10D 62/832* (2025.01)

(58) Field of Classification Search
USPC .......................................................... 257/77
See application file for complete search history.

(56) References Cited

U.S. PATENT DOCUMENTS

| | | | |
|---|---|---|---|
| 2012/0286290 A1* | 11/2012 | Uchida | H01L 21/046 257/77 |
| 2015/0372092 A1* | 12/2015 | Yamamoto | H10D 12/031 257/77 |
| 2017/0250275 A1* | 8/2017 | Yen | H10D 62/127 |
| 2020/0091925 A1* | 3/2020 | Lin | H03M 1/462 |
| 2021/0074863 A1 | 3/2021 | Ohse et al. | |

FOREIGN PATENT DOCUMENTS

| | | |
|---|---|---|
| JP | 2020-13916 A | 1/2020 |
| JP | 2020-74426 A | 5/2020 |
| JP | 2021-44272 | 3/2021 |
| JP | 2021-145024 | 9/2021 |
| WO | WO 2019/124378 A1 | 6/2019 |

* cited by examiner

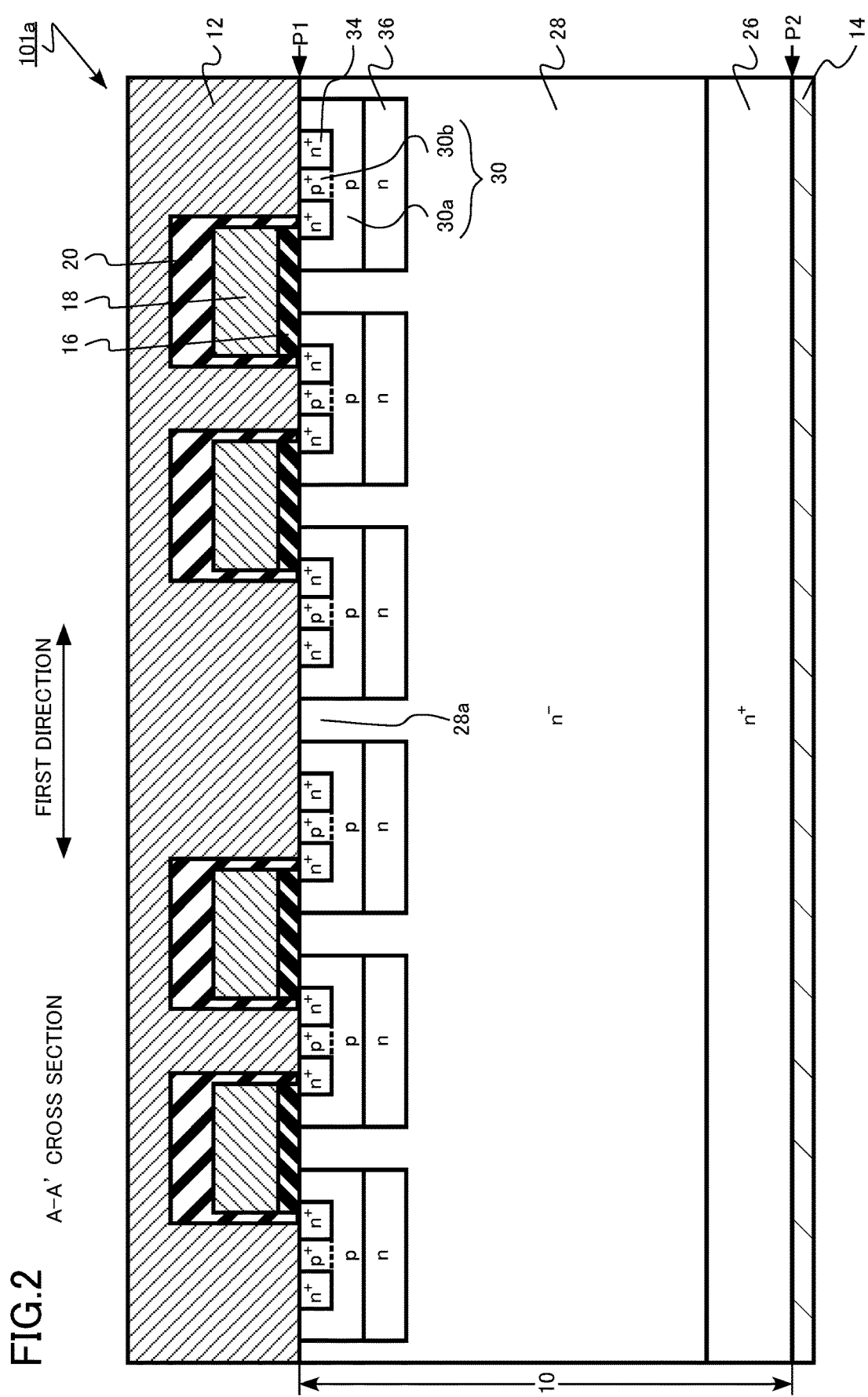

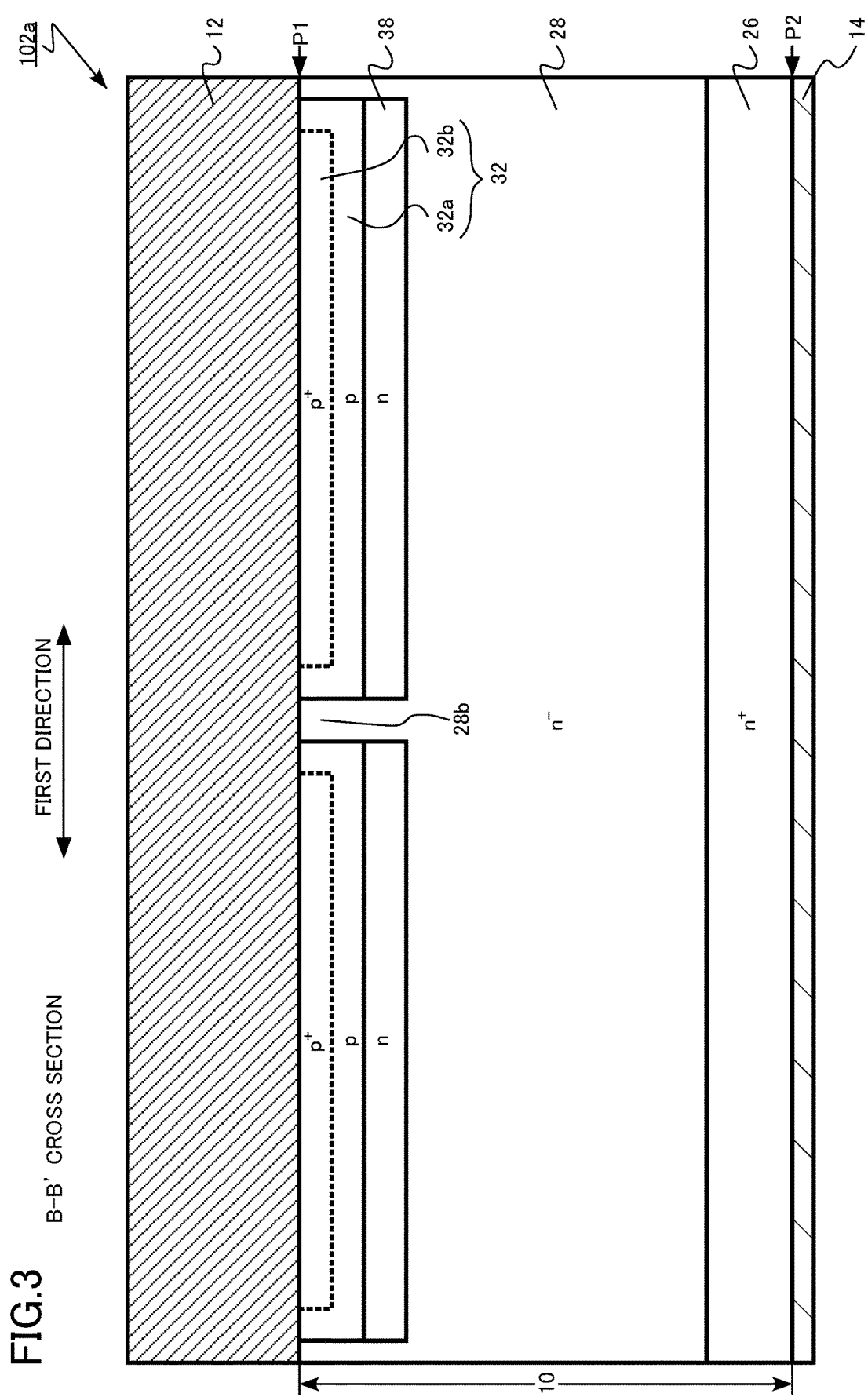

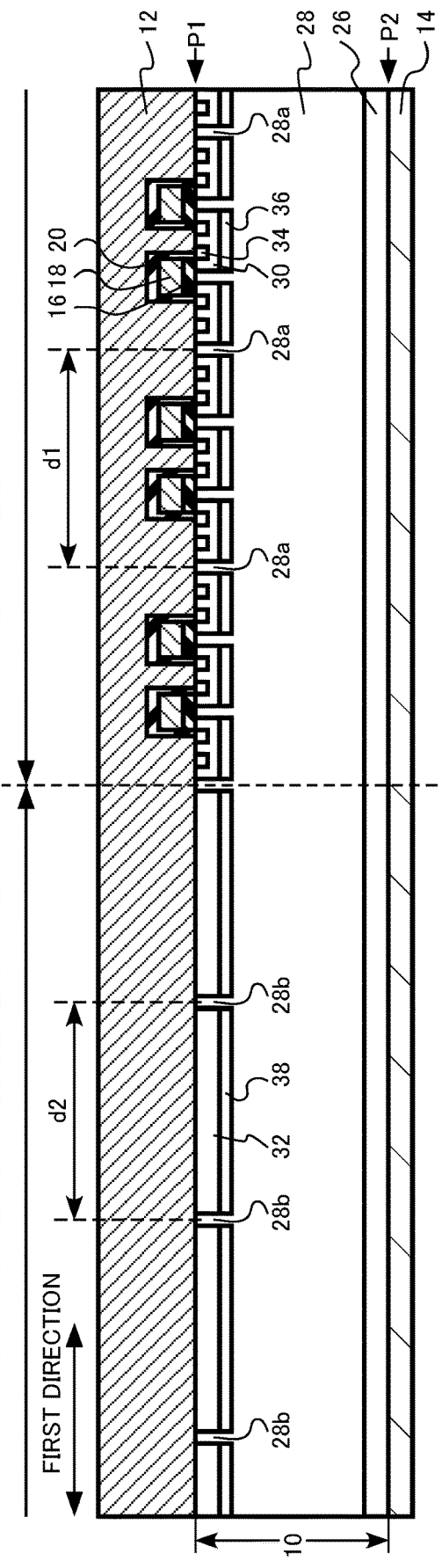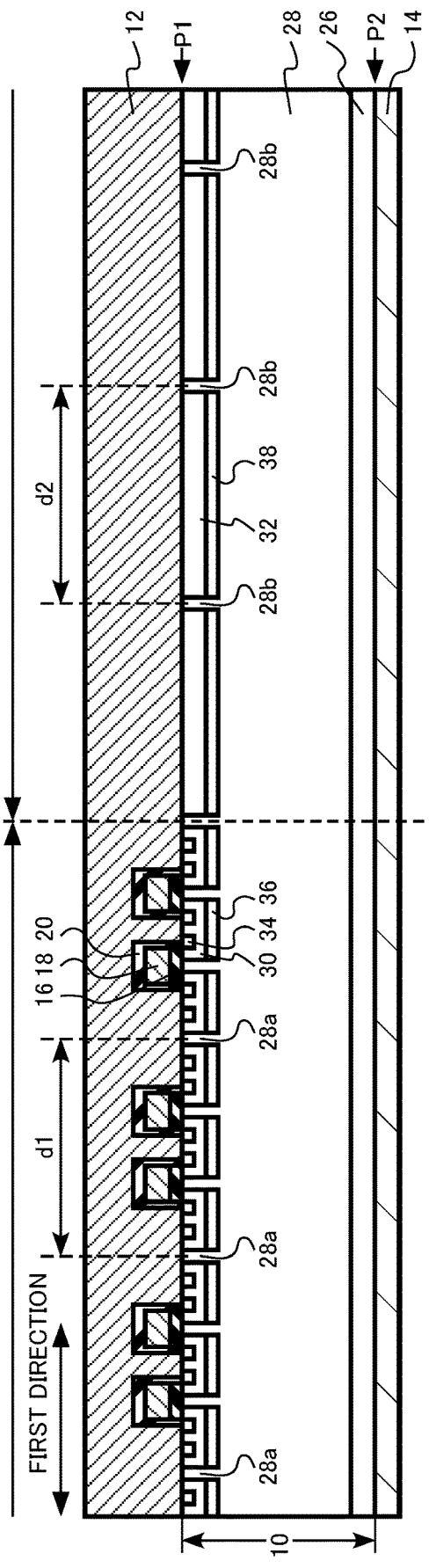

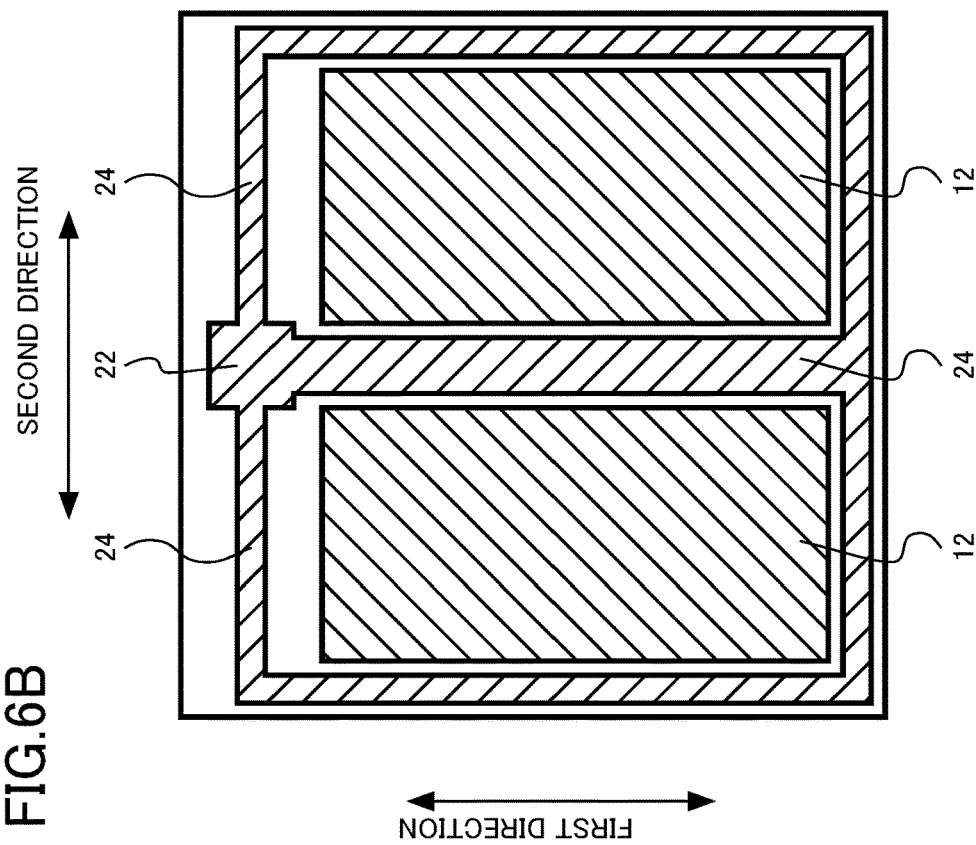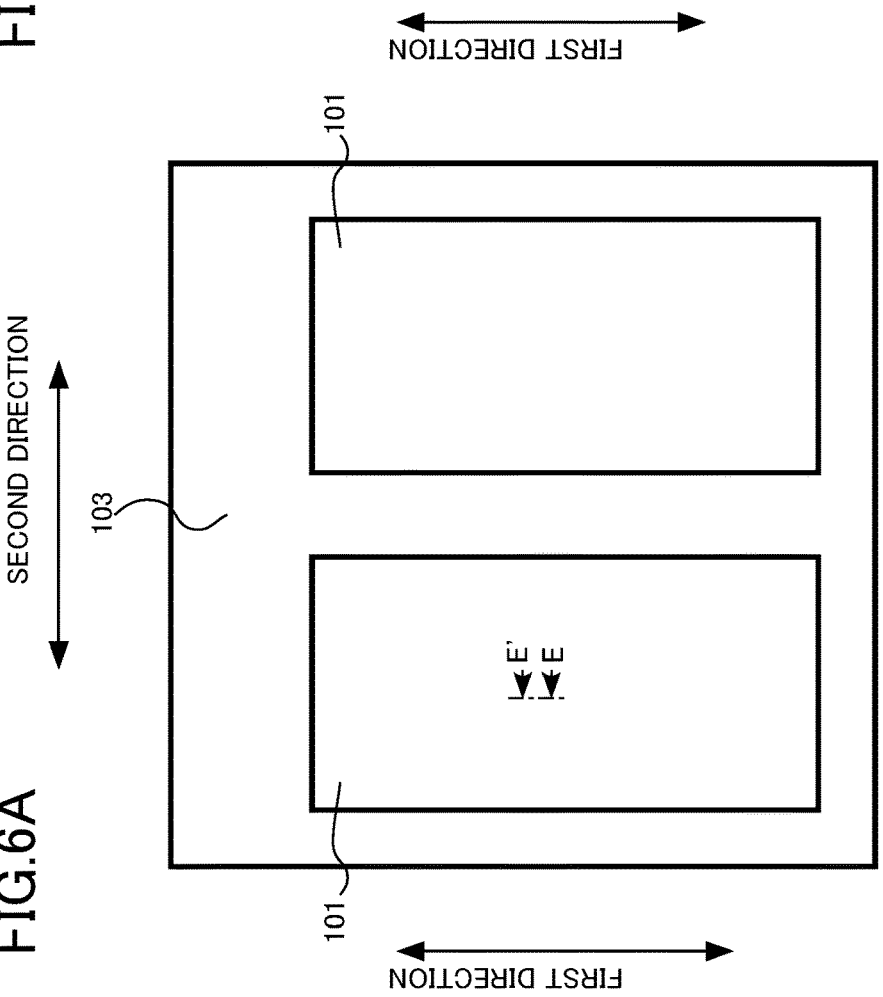

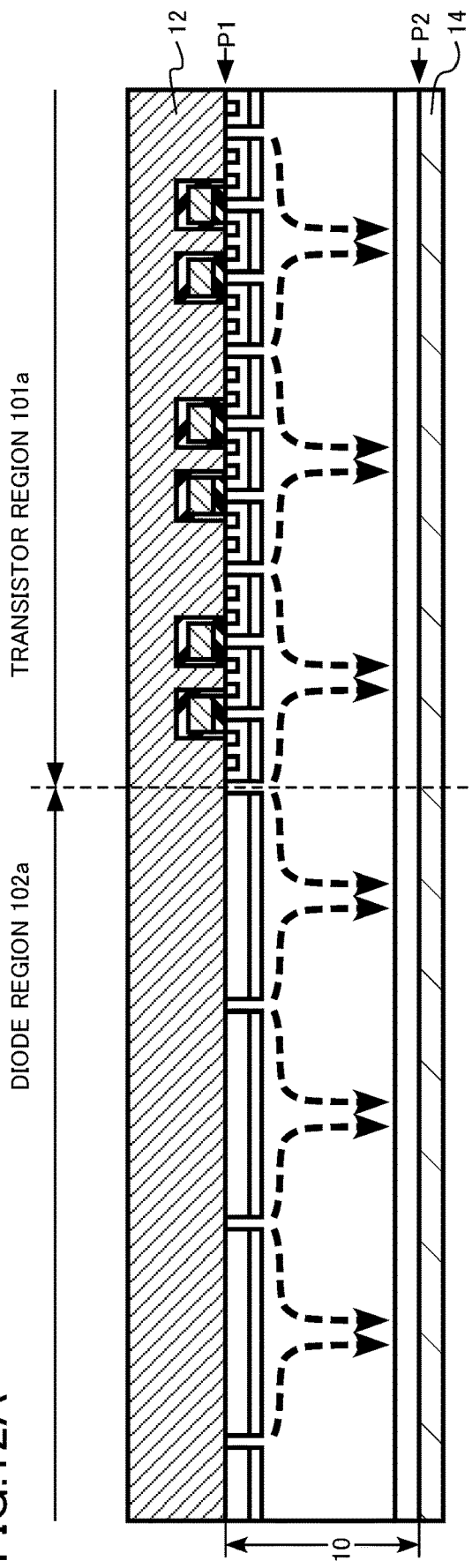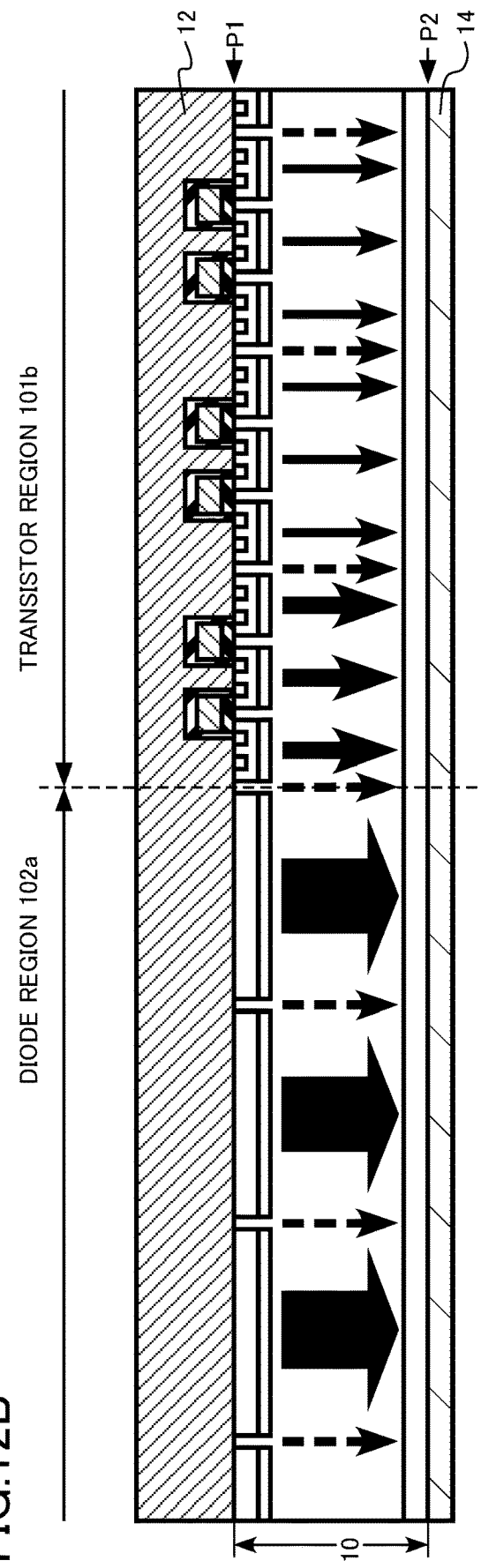

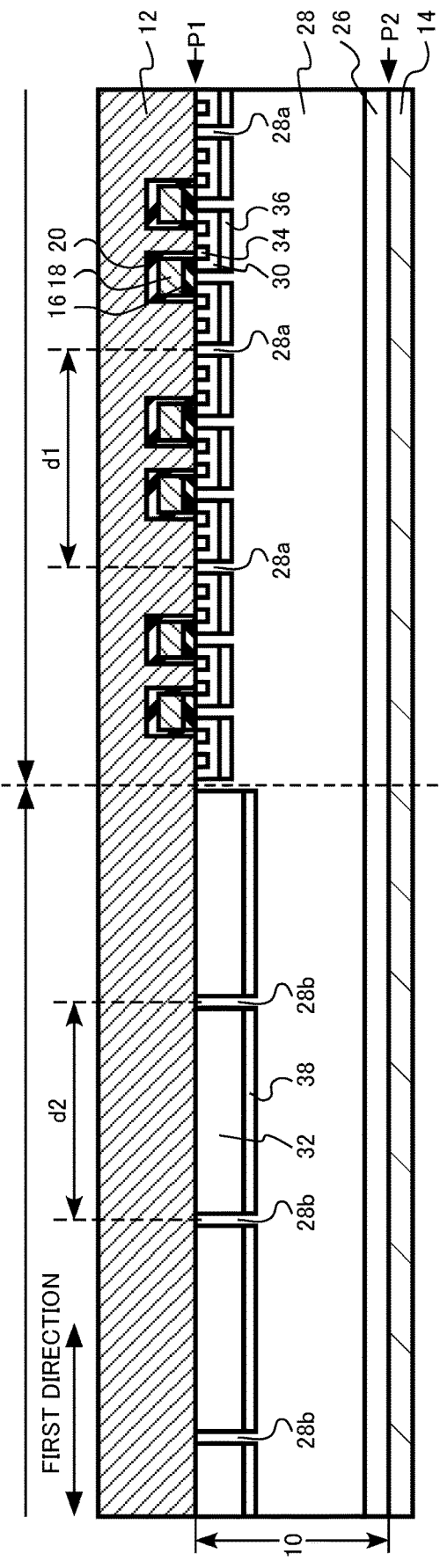
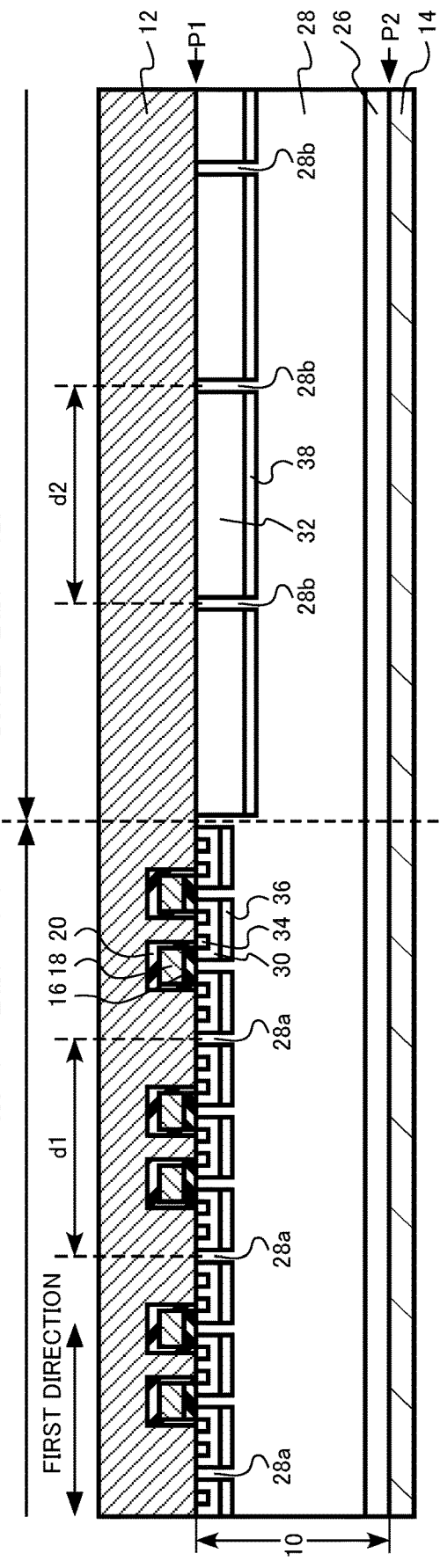
FIG.14A
FIG.14B

US 12,342,583 B2

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2021-190279, filed on Nov. 24, 2021, the entire contents of which are incorporated herein by reference.

FIELD

Embodiments described herein relate generally to a semiconductor device, an inverter circuit, a drive device, a vehicle, and an elevator.

BACKGROUND

Silicon carbide is expected as a material for a next-generation semiconductor device. The silicon carbide has excellent physical properties such as a band gap of 3 times, a breakdown field strength of about 10 times, and a thermal conductivity of about 3 times those of silicon. By utilizing this characteristic, for example, a metal oxide semiconductor field effect transistor (MOSFET) capable of operating at a high breakdown voltage, a low loss, and a high temperature can be realized.

A vertical MOSFET using silicon carbide includes a pn junction diode as a built-in diode. For example, the MOSFET is used as a switching element connected to an inductive load. In this case, even though the MOSFET is turned off, a reflux current can flow by using the built-in diode.

However, when the reflux current flows using a body diode, there is a problem that a stacking fault grows in a silicon carbide layer due to recombination energy of carriers and an on-resistance of the MOSFET increases. An increase in the on-resistance of the MOSFET causes a decrease in reliability of the MOSFET. For example, a Schottky barrier diode (SBD) that performs a unipolar operation as the built-in diode is provided in the MOSFET, and thus, it is possible to suppress the growth of the stacking fault in the silicon carbide layer. The reliability of the MOSFET is improved by providing the SBD as the built-in diode in the MOSFET.

A large surge current may flow through the MOSFET instantaneously beyond a steady state. When the large surge current flows, a large surge voltage is applied to generate heat, and the MOSFET is broken. A maximum allowable peak current value ($I_{FSM}$) of the surge current allowed by the MOSFET is referred to as a surge current tolerance. In the MOSFET provided with the SBD, it is desired to improve the surge current tolerance.

BRIEF DESCRIPTION OF THE DRAWINGS

FIG. 2 is a schematic cross-sectional view of the semiconductor device of the first embodiment;

FIG. 3 is a schematic cross-sectional view of the semiconductor device of the first embodiment;

FIGS. 4A and 4B are schematic cross-sectional views of the semiconductor device of the first embodiment;

FIGS. 6A and 6B are schematic top views of a semiconductor device of a first comparative example;

FIGS. 12A and 12B are explanatory diagrams of the functions and effects of the semiconductor device of the first embodiment;

FIGS. 14A and 14B are schematic cross-sectional views of a semiconductor device of a fourth embodiment;

DETAILED DESCRIPTION

Figure 1B:
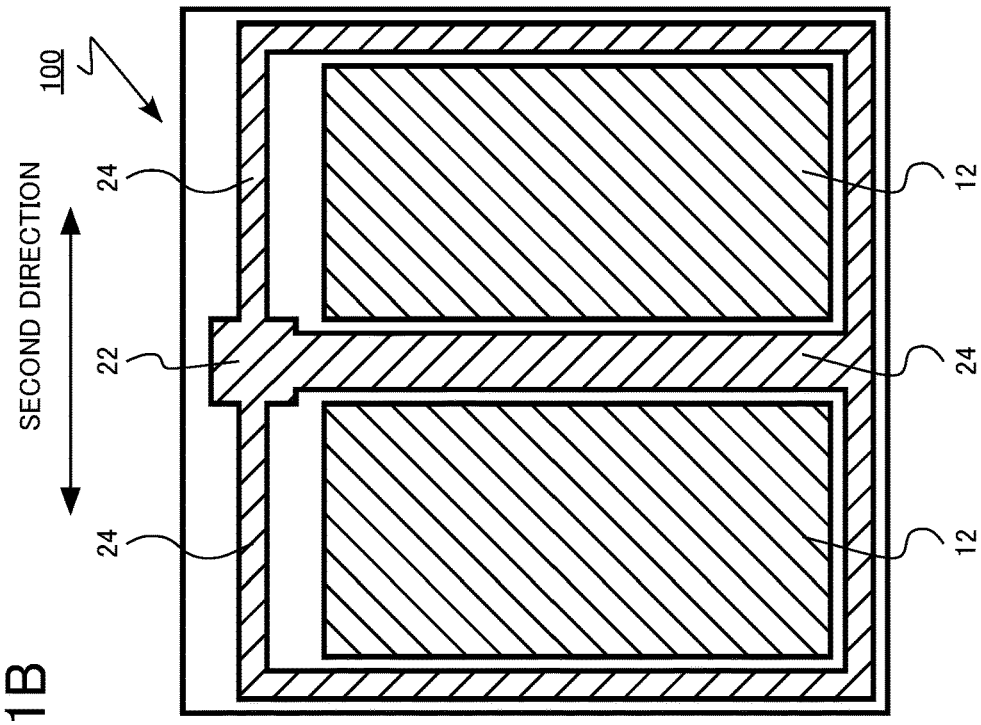
FIGS. 1A and 1B are schematic top views of a semiconductor device of a first embodiment.

A semiconductor device of an embodiment includes a plurality of transistor regions, and at least one diode region. The transistor regions include a silicon carbide layer that has a first plane and a second plane facing the first plane, the silicon carbide layer including an n-type first silicon carbide region having a plurality of first portions in contact with the first plane, a p-type second silicon carbide region provided between the first silicon carbide region and the first plane, and an n-type third silicon carbide region provided between the second silicon carbide region and the first plane, a first electrode in contact with the first portions, the second silicon carbide region, and the third silicon carbide region, a second electrode in contact with the second plane, a gate electrode that faces the second silicon carbide region, and a gate insulating layer provided between the gate electrode and the second silicon carbide region, the at least one diode region includes the silicon carbide layer that includes the n-type first silicon carbide region having a plurality of second portions in contact with the first plane and a p-type fourth silicon carbide region provided between the first silicon carbide region and the first plane, the first electrode in contact with second portions and the fourth silicon carbide region, and the second electrode, an occupied area per unit area of the fourth silicon carbide region projected onto the first plane is larger than an occupied area per unit area of the second silicon carbide region projected onto the first plane, and a first diode region which is one of the at least one diode region is provided between a first transistor region which is one of the plurality of transistor regions and a second transistor region which is one of the plurality of transistor regions provided in a first direction parallel to the first plane with respect to the first transistor region.

Hereinafter, embodiments of the present disclosure will be described with reference to the drawings. In the following description, the same or similar members will be denoted by the same reference numerals, and the description of the members once described may be appropriately omitted.

In the following description, the notations of $n^+$, n, $n^-$, $p^+$, p, and $p^-$ indicate relative levels of impurity concentrations in conductivity types. That is, has an n-type impurity concentration relatively higher than n, and $n^-$ has an n-type impurity concentration relatively lower than n. $p^+$ has a p-type impurity concentration relatively higher than p, and $p-$ has a p-type impurity concentration relatively lower than p. In some cases, $n^+$-type and $n^-$-type are simply referred to as n-type, and $p^+$-type and $p^-$-type are simply referred to as p-type.

The impurity concentration can be measured by, for example, secondary-ion mass spectrometry (SIMS). The relative level of the impurity concentration can be determined from a level of a carrier concentration obtained by, for example, scanning capacitance microscopy (SCM). Distances such as a depth and a thickness of an impurity region can be obtained by, for example, SIMS. Distances such as a depth, a thickness, a width, and an interval of the impurity region can be obtained from, for example, a composite image of an SCM image and an atomic force microscope (AFM) image.

In the present specification, an impurity concentration of a semiconductor region means a maximum impurity concentration of the semiconductor region unless otherwise stated.

First Embodiment

A semiconductor device of a first embodiment includes a plurality of transistor regions and at least one diode region. The plurality of transistor regions include a silicon carbide layer that has a first plane and a second plane facing the first plane, the silicon carbide layer including an n-type first silicon carbide region having a plurality of first portions in contact with the first plane, a p-type second silicon carbide region provided between the first silicon carbide region and the first plane, and an n-type third silicon carbide region provided between the second silicon carbide region and the first plane, a first electrode in contact with the first portions, the second silicon carbide region, and the third silicon carbide region, a second electrode in contact with the second plane, a gate electrode that faces the second silicon carbide region, and a gate insulating layer provided between the gate electrode and the second silicon carbide region. The at least one diode region includes the silicon carbide layer that includes the n-type first silicon carbide region having a plurality of second portions in contact with the first plane and a p-type fourth silicon carbide region provided between the first silicon carbide region and the first plane, the first electrode in contact with the plurality of second portions and the fourth silicon carbide region, and the second electrode. An occupied area per unit area of the fourth silicon carbide region projected onto the first plane is larger than an occupied area per unit area of the second silicon carbide region projected onto the first plane. A first diode region which is one of the at least one diode region is provided between a first transistor region which is one of the plurality of transistor regions and a second transistor region which is one of the plurality of transistor regions provided in a first direction parallel to the first plane with respect to the first transistor region.

The semiconductor device of the first embodiment is a planar gate type vertical MOSFET 100 using silicon carbide. The MOSFET 100 of the first embodiment is, for example, a double implantation MOSFET (DIMOSFET) in which a body region and a source region are formed by ion implantation. The semiconductor device of the first embodiment includes a Schottky barrier diode (SBD) as a built-in diode. The MOSFET 100 is a vertical n-channel MOSFET using electrons as carriers.

Figure 1A:
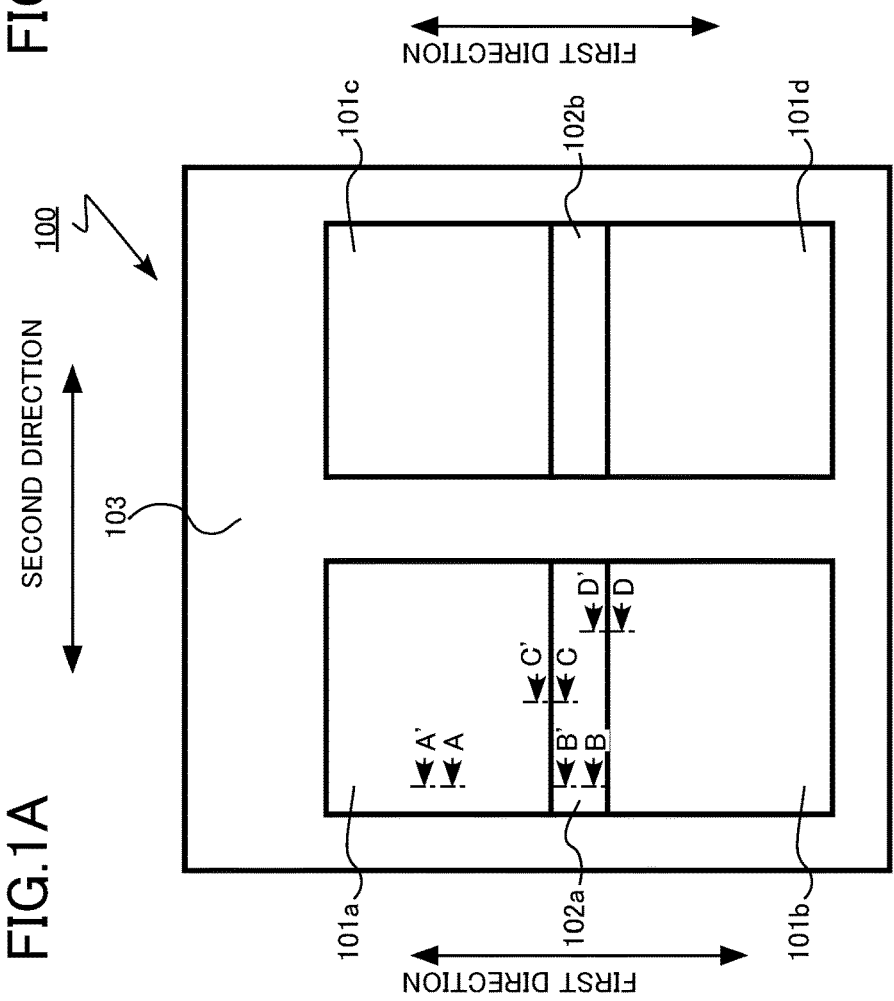

FIGS. 1A and 1B are schematic top views of the semiconductor device of the first embodiment. FIG. 1A is an arrangement diagram of each region included in the MOSFET 100. FIG. 1B is a diagram illustrating patterns of electrodes and wirings on an upper surface of the MOSFET 100.

FIG. 2 is a schematic cross-sectional view of the semiconductor device of the first embodiment. FIG. 2 is a cross-sectional view taken along a line AA' of FIG. 1A.

FIG. 3 is a schematic cross-sectional view of the semiconductor device of the first embodiment. FIG. 3 is a cross-sectional view taken along a line BB' of FIG. 1A.

FIGS. 4A and 4B are schematic cross-sectional views of the semiconductor device of the first embodiment. FIG. 4A is a cross-sectional view taken along a line CC' of FIG. 1A. FIG. 4B is a cross-sectional view taken along a line DD' of FIG. 1A.

As illustrated in FIG. 1A, the MOSFET 100 includes a transistor region 101a (first transistor region), a transistor region 101b (second transistor region), a transistor region 101c, a transistor region 101d, a diode region 102a (first diode region), a diode region 102b, and a termination region 103. The transistor region 101a is an example of a first transistor region. The transistor region 101b is an example of a second transistor region. The diode region 102a is an example of a first diode region.

Hereinafter, the transistor region 101a, the transistor region 101b, the transistor region 101c, and the transistor region 101d may be simply referred to as a transistor region 101 individually or collectively. The diode region 102a and the diode region 102b may be simply referred to as a diode region 102 individually or collectively.

A MOSFET and an SBD are provided in the transistor region 101. An SBD is provided in the diode region 102. A MOSFET is not provided in the diode region 102.

The termination region 103 surrounds the transistor region 101 and the diode region 102. A structure for improving a breakdown voltage of the MOSFET 100 is provided in the termination region 103. The structure for improving the breakdown voltage of the MOSFET 100 is, for example, RESURF or a guard ring.

The diode region 102 is provided between two transistor regions 101. For example, the diode region 102a is provided between the transistor region 101a and the transistor region 101b. The transistor region 101b is provided in a first direction parallel to a first plane P1 with respect to the transistor region 101a.

For example, the diode region 102b is provided between the transistor region 101c and the transistor region 101d. The transistor region 101d is provided in the first direction with respect to the transistor region 101c.

A width of the diode region 102 in the first direction is equal to or more than, for example, 30 μm. For example, a width of the diode region 102a in the first direction is equal to or more than 30 μm.

The MOSFET 100 includes a silicon carbide layer 10, a source electrode 12 (first electrode), a drain electrode 14 (second electrode), a gate insulating layer 16, a gate electrode 18, an interlayer insulating layer 20, a gate electrode pad 22, and a gate wiring 24.

The silicon carbide layer 10 includes an n$^+$-type drain region 26, an n$^-$-type drift region 28 (first silicon carbide region), a p-type body region 30 (second silicon carbide region), a p-type p region 32 (fourth silicon carbide region), an n$^+$-type source region 34 (third silicon carbide region), an n-type first bottom region 36 (fifth silicon carbide region), and an n-type second bottom region 38 (sixth silicon carbide region).

The drift region 28 includes a plurality of first portions 28a and a plurality of second portions 28b. The body region 30 includes a low concentration portion 30a and a high concentration portion 30b. The p region 32 includes a low concentration portion 32a and a high concentration portion 32b.

The silicon carbide layer 10 is provided between the source electrode 12 and the drain electrode 14. The silicon carbide layer 10 is provided between the gate electrode 18 and the drain electrode 14. The silicon carbide layer 10 is a single crystal SiC. The silicon carbide layer 10 is, for example, 4H—SiC.

The silicon carbide layer 10 includes a first plane ("P1" in FIG. 2) and a second plane ("P2" in FIG. 2). The first plane P1 and the second plane P2 face each other. Hereinafter, the first plane may be referred to as a front surface, and the second plane may be referred to as a back surface. Hereinafter, the "depth" means a depth using the first plane as a reference.

The first plane P1 is, for example, a plane inclined with respect to a (0001) plane by an angle equal to or more than 0 degrees and equal to or less than 8 degrees. The second plane P2 is, for example, a plane inclined with respect to a (000-1) plane by an angle equal to or more than 0 degrees and equal to or less than 8 degrees. The (0001) plane is called a silicon face. The (000-1) plane is called a carbon face.

The n$^+$-type drain region 26 is provided on a side of the back surface of the silicon carbide layer 10. The drain region 26 contains, for example, nitrogen (N) as an n-type impurity. For example, an n-type impurity concentration of the drain region 26 is equal to or more than $1\times10^{18}$ cm$^{-3}$ and is equal to or less than $1\times10^{21}$ cm$^{-3}$.

The n$^-$-type drift region 28 is provided between the drain region 26 and the first plane P1. The drift region 28 is provided between the source electrode 12 and the drain electrode 14. The drift region 28 is provided between the gate electrode 18 and the drain electrode 14.

The n$^-$-type drift region 28 is provided on the drain region 26. The drift region 28 contains, for example, nitrogen (N) as an n-type impurity. An n-type impurity concentration of the drift region 28 is lower than the n-type impurity concentration of the drain region 26. For example, the n-type impurity concentration of the drift region 28 is equal to or more than $4\times10^{14}$ cm$^{-3}$ and is equal to or less than $1\times10^{17}$ cm$^{-3}$. For example, a thickness of the drift region 28 is equal to or more than 5 µm and is equal to or less than 150 µm.

The drift region 28 includes the plurality of first portions 28a and the plurality of second portions 28b. The first portion 28a is in contact with the first plane P1. The first portion 28a is sandwiched between the two body regions 30. The first portion 28a functions as an n-type semiconductor region of the SBD.

The second portion 28b is in contact with the first plane P1. The second portion 28b is sandwiched between the two p regions 32. The second portion 28b functions as an n-type semiconductor region of the SBD.

The p-type body region 30 is disposed between the drift region 28 and the first plane P1. A part of the body region 30 functions as a channel formation region of the MOSFET 100. The body region 30 functions as a p-type semiconductor region of a pn junction diode.

The body region 30 includes the low concentration portion 30a and the high concentration portion 30b. The high concentration portion 30b is provided between the low concentration portion 30a and the first plane P1. A p-type impurity concentration of the high concentration portion 30b is higher than a p-type impurity concentration of the low concentration portion 30a.

The body region 30 contains, for example, aluminum (Al) as a p-type impurity. For example, the p-type impurity concentration of the low concentration portion 30a is equal to or more than $1\times10^{16}$ cm$^{-3}$ and is equal to or less than $5\times10^{17}$ cm$^{-3}$. For example, the p-type impurity concentration of the high concentration portion 30b is equal to or more than $1\times10^{18}$ cm$^{-3}$ and is equal to or less than $1\times10^{21}$ cm$^{-3}$.

For example, a depth of the body region 30 is equal to or more than 0.3 µm and is equal to or less than 1.0 µm.

The body region 30 is fixed at an electric potential as the source electrode 12.

The p-type p region 32 is provided between the drift region 28 and the first plane P1. The p region 32 functions as a p-type semiconductor region of a pn junction diode.

The p region 32 includes the low concentration portion 32a and the high concentration portion 32b. The high concentration portion 32b is provided between the low concentration portion 32a and the first plane P1. The p-type impurity concentration of the high concentration portion 32b is higher than the p-type impurity concentration of the low concentration portion 32a.

The p region 32 contains, for example, aluminum (Al) as a p-type impurity. For example, the p-type impurity concentration of the low concentration portion 32a is equal to or more than $1\times10^{16}$ cm$^{-3}$ and is equal to or less than $5\times10^{17}$ cm$^{-3}$. For example, the p-type impurity concentration of the high concentration portion 32b is equal to or more than $1\times10^{18}$ cm$^{-3}$ and is equal to or less than $1\times10^{21}$ cm$^{-3}$.

The p-type impurity concentration of the low concentration portion 32a of the p region 32 is substantially equal to, for example, the p-type impurity concentration of the low concentration portion 30a of the body region 30.

The p-type impurity concentration of the high concentration portion 32b of the p region 32 is substantially equal to, for example, the p-type impurity concentration of the high concentration portion 30b of the body region 30.

A width of the p region 32 in the first direction is larger than, for example, a width of the body region 30 in the first direction. For example, a depth of the p region 32 is equal to or more than 0.3 µm and is equal to or less than 1.0 µm.

The p region 32 is fixed to the electric potential of the source electrode 12.

The n$^+$-type source region 34 is provided between the body region 30 and the first plane P1. The source region 34 is provided between the low concentration portion 30a of the body region 30 and the first plane P1.

The source region 34 contains, for example, phosphorus (P) as an n-type impurity. An n-type impurity concentration of the source region 34 is higher than the n-type impurity concentration of the drift region 28.

For example, the n-type impurity concentration of the source region 34 is equal to or more than $1\times10^{10}$ cm$^{-3}$ and is equal to or less than $1\times10^{21}$ cm$^{-3}$. A depth of the source region 34 is less than the depth of the body region 30. For example, the depth of the source region 34 is equal to or more than 0.1 µm and is equal to or less than 0.3 µm.

The n-type first bottom region 36 is provided between the drift region 28 and the body region 30. The first bottom region 36 is in contact with, for example, the drift region 28 and the body region 30. A width of the first bottom region 36 in the first direction is, for example, substantially equal to the width of the body region 30 in the first direction.

The first bottom region 36 contains, for example, nitrogen (N) as an n-type impurity. An n-type impurity concentration of the first bottom region 36 is higher than the n-type impurity concentration of the drift region 28.

For example, the n-type impurity concentration of the first bottom region 36 is equal to or more than $1\times10^{16}$ cm$^{-3}$ and is equal to or less than $2\times10^{17}$ cm$^{-3}$. For example, a thickness of the first bottom region 36 is equal to or more than 0.4 µm and is equal to or less than 1.5 µm.

The n-type second bottom region 38 is provided between the drift region 28 and the p region 32. The second bottom region 38 is in contact with, for example, the drift region 28 and the p region 32. A width of the second bottom region 38 in the first direction is, for example, substantially equal to the width of the p region 32 in the first direction.

The second bottom region 38 contains, for example, nitrogen (N) as an n-type impurity. An n-type impurity concentration of the second bottom region 38 is higher than the n-type impurity concentration of the drift region 28. The n-type impurity concentration of the second bottom region 38 is, for example, substantially equal to the n-type impurity concentration of the first bottom region 36.

For example, the n-type impurity concentration of the second bottom region 38 is equal to or more than $1\times10^{16}$ cm$^{-3}$ and is equal to or less than $2\times10^{17}$ cm$^{-3}$. For example, a thickness of the second bottom region 38 is equal to or more than 0.4 µm and is equal to or less than 1.5 µm.

The gate electrode 18 is provided on a side of the first plane P1 of the silicon carbide layer 10. The gate electrode 18 extends in a second direction parallel to the first plane P1 and orthogonal to the first direction. A plurality of gate electrodes 18 are arranged in parallel in the first direction. The gate electrode 18 has a so-called stripe shape.

The gate electrode 18 is a conductive layer. The gate electrode 18 is, for example, polycrystalline silicon containing a p-type impurity or an n-type impurity.

The gate electrode 18 faces, for example, a portion in contact with the first plane P1 of the body region 30. The gate electrode 18 faces, for example, a portion in contact with the first plane P1 of the drift region 28.

The gate insulating layer 16 is provided between the gate electrode 18 and the body region 30. The gate insulating layer 16 is provided between the gate electrode 18 and the drift region 28.

The gate insulating layer 16 is, for example, a silicon oxide. For example, a high-k insulating material (high dielectric constant insulating material) can be applied to the gate insulating layer 16.

The interlayer insulating layer 20 is provided on the gate electrode 18 and the silicon carbide layer 10. The interlayer insulating layer 20 is provided between the gate electrode 18 and the source electrode 12. The interlayer insulating layer 20 is, for example, a silicon oxide.

The source electrode 12 is provided on the side of the first plane P1 of the silicon carbide layer 10. The source electrode 12 is in contact with the first plane P1.

The source electrode 12 is in contact with the first portion 28a of the drift region 28, the second portion 28b of the drift region 28, the body region 30, the p region 32, and the source region 34.

The source electrode 12 contains metal. The metal for forming the source electrode 12 has, for example, a stacked structure of titanium (Ti) and aluminum (Al).

A portion of the source electrode 12 in contact with the body region 30, the p region 32, and the source region 34 is, for example, metal silicide. The metal silicide is, for example, titanium silicide or nickel silicide. For example, metal silicide is not provided in a portion of the source electrode 12 in contact with the first portion 28a of the drift region 28 and the second portion 28b of the drift region 28.

A junction between the body region 30, the p region 32, and the source region 34 and the source electrode 12 is, for example, an ohmic junction. A junction between the first portion 28a of the drift region 28 and the second portion 28b of the drift region 28 and the source electrode 12 is, for example, a Schottky junction.

The drain electrode 14 is provided on a side of the second plane P2 of the silicon carbide layer 10. The drain electrode 14 is in contact with the second plane P2. The drain electrode 14 is in contact with the drain region 26.

The drain electrode 14 is, for example, metal or a metal semiconductor compound. The drain electrode 14 contains, for example, at least one material selected from the group consisting of nickel silicide (NiSi), titanium (Ti), nickel (Ni), silver (Ag), and gold (Au).

A junction between the drain region 26 and the drain electrode 14 is, for example, an ohmic junction.

The gate electrode pad 22 is provided on the side of the first plane P1 of the silicon carbide layer 10. The gate electrode pad 22 is provided on the interlayer insulating layer 20. The gate electrode pad 22 is provided to realize an electrical connection between the outside and the gate electrode 18.

The gate wiring 24 is provided on the side of the first plane P1 of the silicon carbide layer 10. The gate wiring 24 is connected to the gate electrode pad 22. The gate wiring 24 is electrically connected to the gate electrode 18.

The gate electrode pad 22 and the gate wiring 24 contain metal. The metal forming the gate electrode pad 22 and the gate wiring 24 is, for example, a stacked structure of titanium (Ti) and aluminum (Al). The gate electrode pad 22 and the gate wiring 24 are made of, for example, the same material as the source electrode 12.

As illustrated in FIG. 2, the transistor region 101 includes the silicon carbide layer 10, the source electrode 12 (first electrode), the drain electrode 14 (second electrode), the gate insulating layer 16, the gate electrode 18, and the interlayer insulating layer 20. The silicon carbide layer 10 of the transistor region 101 includes the n$^+$-type drain region 26, the n$^-$-type drift region 28 (first silicon carbide region), the p-type body region 30 (second silicon carbide region), the n$^+$-type source region 34 (third silicon carbide region), and the n-type first bottom region 36 (fifth silicon carbide region). The drift region 28 of the transistor region 101 includes the plurality of first portions 28a.

In the transistor region 101, the source electrode 12, the first portion 28a of the drift region 28, the drain region 26, and the drain electrode 14 constitute an SBD. The source electrode 12, the body region 30, the first bottom region 36, the drain region 26, and the drain electrode 14 constitute a pn junction diode.

A first distance (d1 in FIGS. 4A and 4B) between two first portions 28a adjacent to each other with the body region 30 interposed therebetween is, for example, equal to or more than 3 μm and equal to or less than 30 μm.

As illustrated in FIG. 3, the diode region 102 includes the silicon carbide layer 10, the source electrode 12 (first electrode), and the drain electrode 14 (second electrode). The silicon carbide layer 10 of the diode region 102 includes the $n^+$-type drain region 26, the $n^-$-type drift region 28 (first silicon carbide region), the p-type p region 32 (fourth silicon carbide region), and the n-type second bottom region 38 (sixth silicon carbide region). The drift region 28 of the diode region 102 includes the plurality of second portions 28b.

In the diode region 102, the source electrode 12, the second portion 28b of the drift region 28, the drain region 26, and the drain electrode 14 constitute an SBD. The source electrode 12, the p region 32, the second bottom region 38, the drain region 26, and the drain electrode 14 constitute a pn junction diode.

A second distance (d2 in FIGS. 4A and 4B) between two second portions 28b adjacent to each other with the p region 32 interposed therebetween is, for example, equal to or more than 3 μm and equal to or less than 30 μm. The second distance d2 between two second portions 28b adjacent with the p region 32 interposed therebetween is, for example, substantially equal to the first distance d1 between two first portions 28a adjacent with the body region 30 interposed therebetween. The first distance d1 and the second distance d2 are distances in the first direction.

Figure 5:
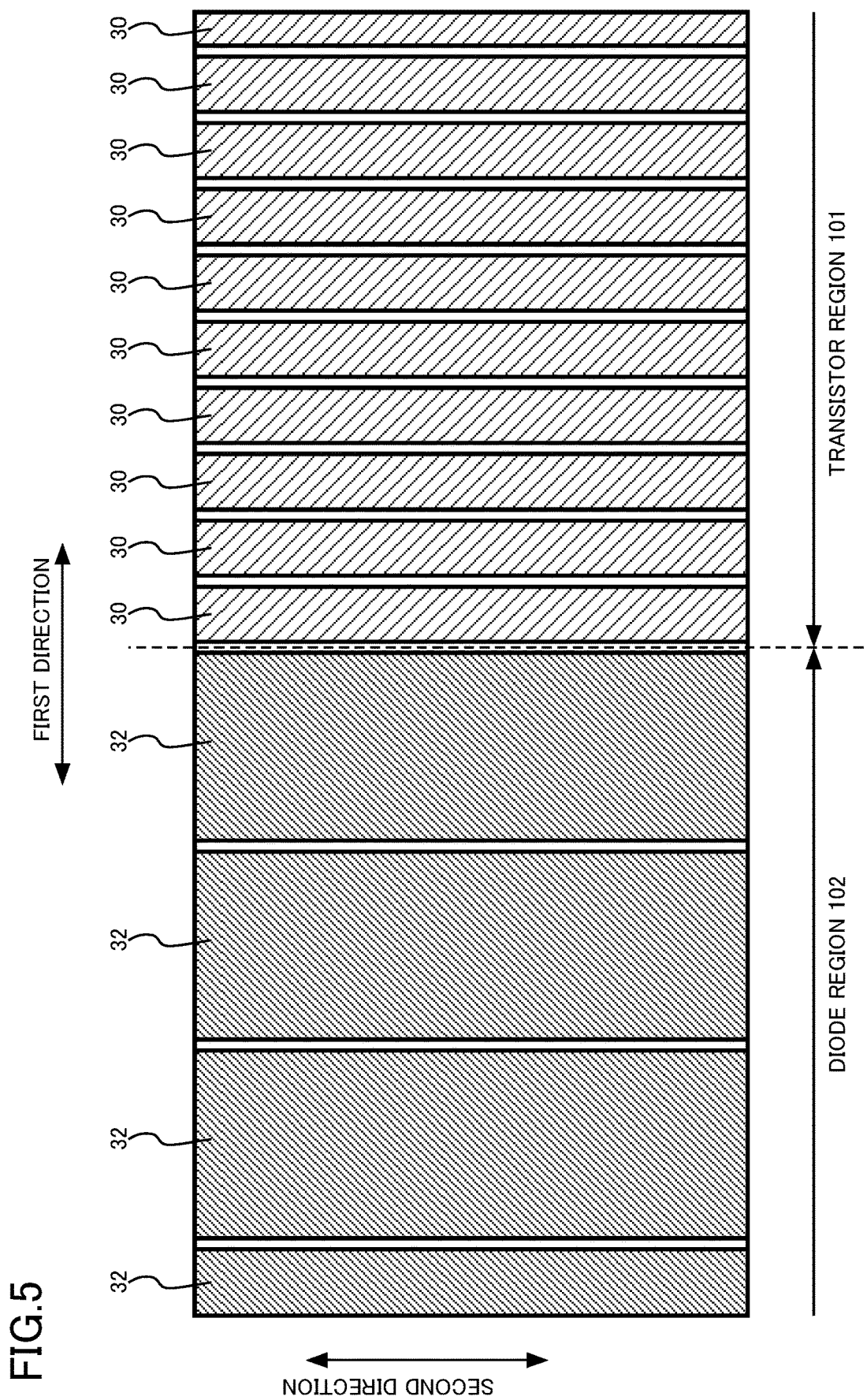
FIG. 5 is a schematic top view of the semiconductor device of the first embodiment.

FIG. 5 is a schematic top view of the semiconductor device of the first embodiment. FIG. 5 is a diagram illustrating a pattern of the body region 30 projected onto the first plane P1 and a pattern of the p region 32 projected onto the first plane P1. The pattern of the body region 30 and the pattern of the p region 32 in FIG. 5 are patterns projected onto the first plane P1 in a direction perpendicular to the first plane P1.

An occupancy rate per unit area of the p region 32 projected on the first plane P1 on the first plane P1 is larger than an occupancy rate per unit area of the body region 30 projected on the first plane P1 on the first plane P1. In other words, in a region having a predetermined size, the occupancy rate of the p region 32 projected onto the first plane P1 on the first plane P1 is larger than the occupancy rate of the body region 30 projected onto the first plane P1 on the first plane P1. That is, an occupation rate of the pn junction diode in the diode region 102 is larger than the occupation rate of the pn junction diode in the transistor region 101.

The occupancy rate per unit area of the p region 32 projected onto the first plane P1 is, for example, equal to or more than 1.2 times and equal to or less than 3 times the occupancy rate per unit area of the body region 30 projected onto the first plane P1.

The unit area is not particularly limited as long as the unit area has a size with which an average occupancy rate of the body region 30 of the transistor region 101 can be compared with an average occupancy of the p region 32 of the diode region 102. The unit area is, for example, 30 μm×30 μm=900 μm².

A contact area per unit area between the source electrode 12 and the p region 32 in the diode region 102 is larger than a contact area per unit area between the source electrode 12 and the body region 30 in the transistor region 101. That is, a contact resistance per unit area between the source electrode 12 and the p region 32 in the diode region 102 is smaller than a contact resistance per unit area between the source electrode 12 and the body region 30 in the transistor region 101.

Next, functions and effects of the MOSFET 100 of the first embodiment will be described.

FIGS. 6A and 6B are schematic top views of the semiconductor device of the first comparative example. FIG. 6A is an arrangement diagram of each region included in the MOSFET of the first comparative example. FIG. 6B is a diagram illustrating patterns of electrodes and wirings on an upper surface of the MOSFET of the first comparative example. FIGS. 6A and 6B are diagrams corresponding to FIGS. 1A and 1B of the first embodiment.

Figure 7:
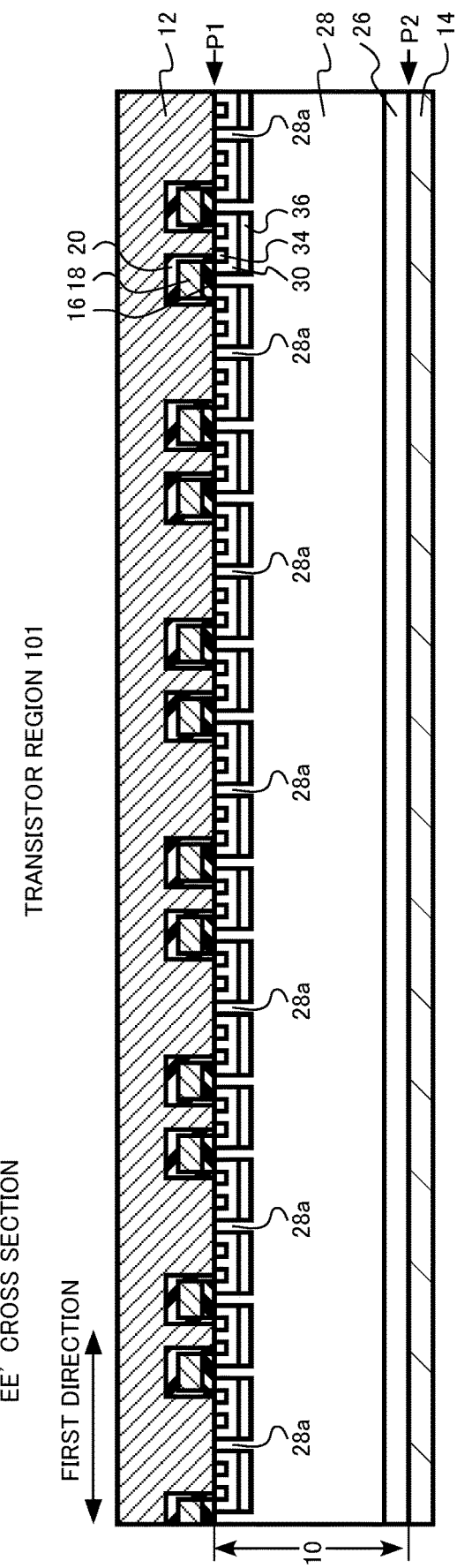
FIG. 7 is a schematic cross-sectional view of the semiconductor device of the first comparative example.

FIG. 7 is a schematic cross-sectional view of the semiconductor device of the first comparative example. FIG. 7 is a cross-sectional view taken along a line EE' of FIG. 6A. FIG. 7 is a diagram corresponding to FIG. 4A of the first embodiment.

The MOSFET of the first comparative example is different from the MOSFET 100 of the first embodiment in that the diode region 102 is not provided.

In a transistor region 101 of the MOSFET of the first comparative example, a MOSFET and an SBD are provided similarly to the MOSFET 100 of the first embodiment.

Figure 8:
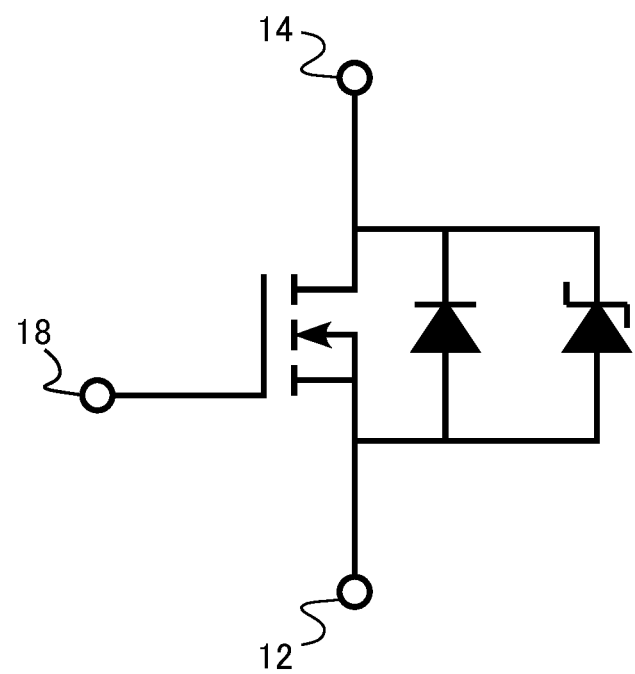
FIG. 8 is an equivalent circuit diagram of the semiconductor device of the first comparative example.

FIG. 8 is an equivalent circuit diagram of the semiconductor device of the first comparative example. Between the source electrode 12 and the drain electrode 14, a pn junction diode and an SBD are connected as built-in diodes in parallel with the transistor.

For example, a case where a MOSFET is used as a switching element connected to an inductive load is considered. When the MOSFET is turned off, a voltage at which the source electrode 12 is positive with respect to the drain electrode 14 may be applied due to a load current caused by an inductive load. In this case, a forward current flows through the built-in diode. This state is also referred to as a reverse conduction state.

A forward voltage (Vf) at which the forward current starts flowing through the SBD is lower than a forward voltage (Vf) of the pn junction diode. Accordingly, first, the forward current flows through the SBD.

The forward voltage (Vf) of the SBD is, for example, 1.0 V. The forward voltage (Vf) of the pn junction diode is, for example, 2.5 V.

The SBD performs a unipolar operation. Thus, even though the forward current flows, a stacking fault does not grow in the silicon carbide layer 10 due to a recombination energy of the carrier.

Figure 9A:
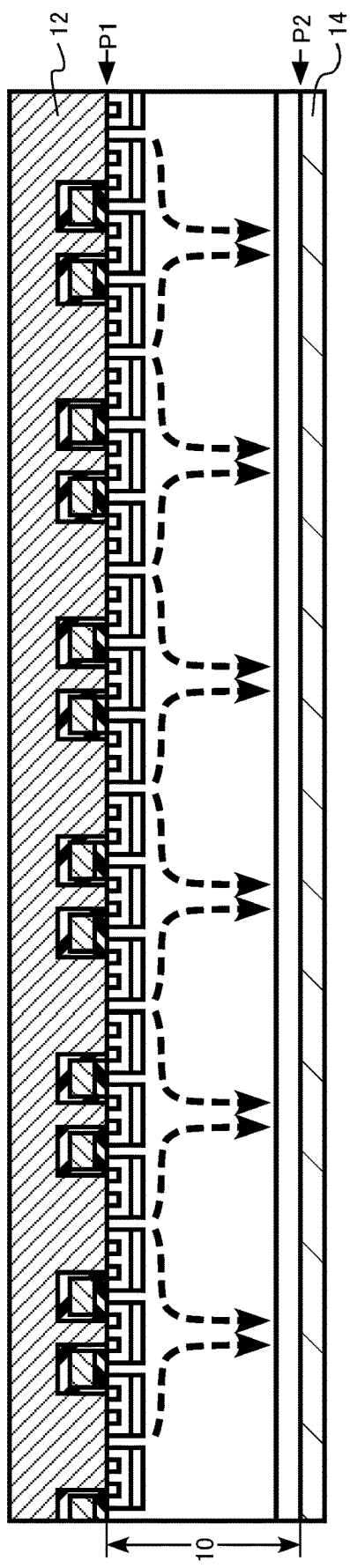
FIGS. 9A and 9B are explanatory diagrams of functions and effects of the semiconductor device of the first embodiment.
Figure 9B:
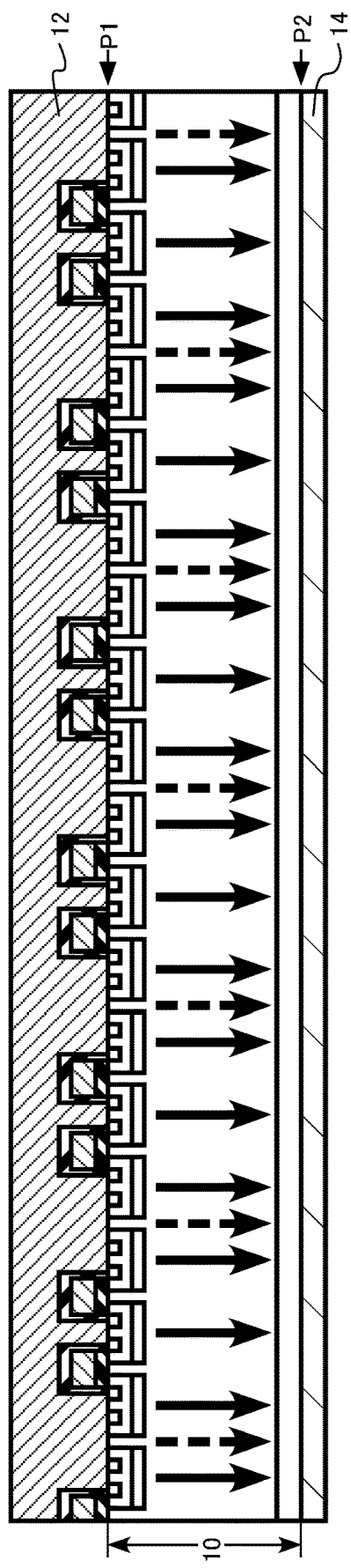

FIGS. 9A and 9B are explanatory diagrams of functions and effects of the semiconductor device of the first embodiment. FIGS. 9A and 9B are schematic cross-sectional views of the first comparative example. FIGS. 9A and 9B are diagrams corresponding to FIG. 7.

FIGS. 9A and 9B are diagrams illustrating a current flowing through the built-in diode of the MOSFET of the first comparative example. FIG. 9A illustrates a state where the forward current flows only through the SBD, and FIG. 9B illustrates a state where the forward current flows through the SBD and the pn junction diode.

That is, FIG. 9A illustrates a state where the voltage applied between the pn junctions of the pn junction diodes is lower than the forward voltage (Vf) of the pn junction diode. FIG. 9B illustrates a state where the voltage applied between the pn junctions of the pn junction diodes is higher than the forward voltage (Vf) of the pn junction diode.

In FIGS. 9A and 9B, a dotted arrow indicates the current flowing through the SBD. In FIG. 9B, a solid arrow indicates the current flowing through the pn junction diode.

As illustrated in FIG. 9A, the current flowing through the SBD flows around a bottom of the body region 30. Thus, an electrostatic potential flows around in the drift region 28 facing the bottom of the body region 30. The electrostatic potential flows around, and thus, the voltage applied between the body region 30 and the drift region 28 is reduced.

Accordingly, at the bottom of the body region 30, the voltage hardly exceeds the forward voltage (Vf) of the pn junction diode. In other words, the forward voltage (Vf) of the pn junction diode of the MOSFET of the first comparative example can be set to be higher than a case where the SBD is not provided. Accordingly, a bipolar operation of the pn junction diode is suppressed, and the formation of the stacking fault in the silicon carbide layer 10 due to the recombination energy of the carrier is suppressed.

The forward voltage (Vf) of the pn junction diode of the MOSFET of the first comparative example depends on an interval between two SBDs adjacent in the first direction. The interval between two SBDs adjacent in the first direction is reduced, and thus, the forward voltage (Vf) of the pn junction diode of the MOSFET of the first comparative example can be increased.

A large surge current exceeding a steady state may be instantaneously applied to the MOSFET. The surge current flows from the source electrode 12 toward the drain electrode 14.

When the large surge current flows, a large surge voltage is applied to generate heat, and the MOSFET is broken. A maximum allowable peak current value ($I_{FSM}$) of the surge current allowed by the MOSFET is referred to as a surge current tolerance. In the MOSFET provided with the SBD, it is desired to improve the surge current tolerance.

When the large surge voltage is applied to the MOSFET of the first comparative example, the voltage applied between the pn junctions of the pn junction diodes becomes higher than the forward voltage (Vf) of the pn junction diode.

When the voltage applied between the pn junctions of the pn junction diodes becomes higher than the forward voltage (Vf) of the pn junction diode, a current also flows through the pn junction diode as illustrated in FIG. 9B.

Figure 10:
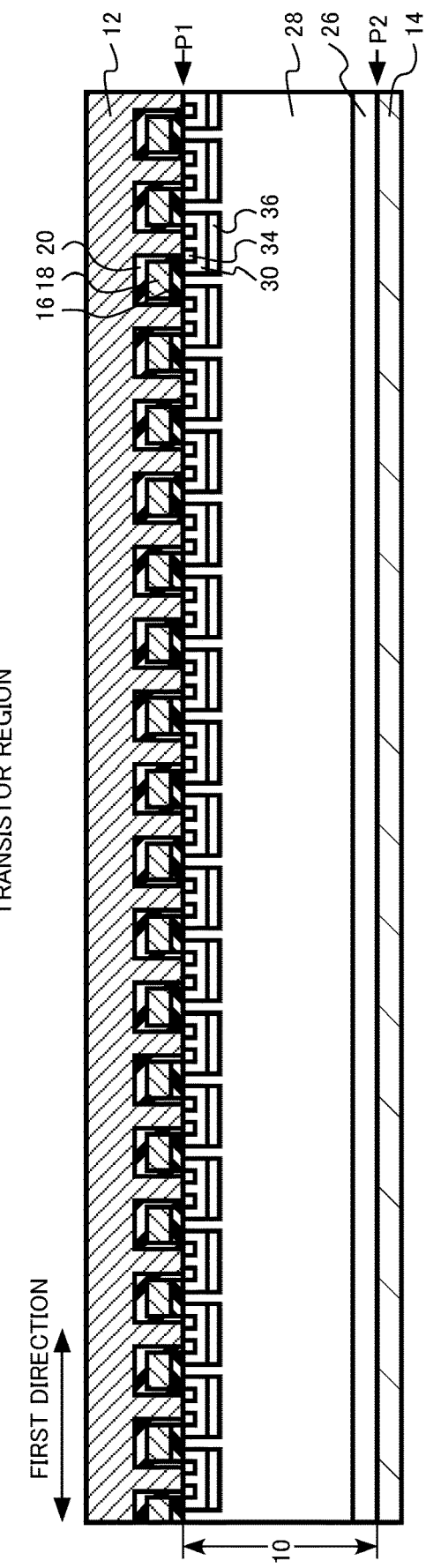
FIG. 10 is an explanatory diagram of the functions and effects of the semiconductor device of the first embodiment.

FIG. 10 is an explanatory diagram of the functions and effects of the semiconductor device of the first embodiment. FIG. 10 is a schematic cross-sectional view of a second comparative example. FIG. 10 is a diagram corresponding to FIG. 7 of the first comparative example.

A MOSFET of the second comparative example is different from the MOSFET of the first comparative example in that the transistor region does not include the SBD. A built-in diode of the MOSFET of the second comparative example is only a pn junction diode.

Figure 11:
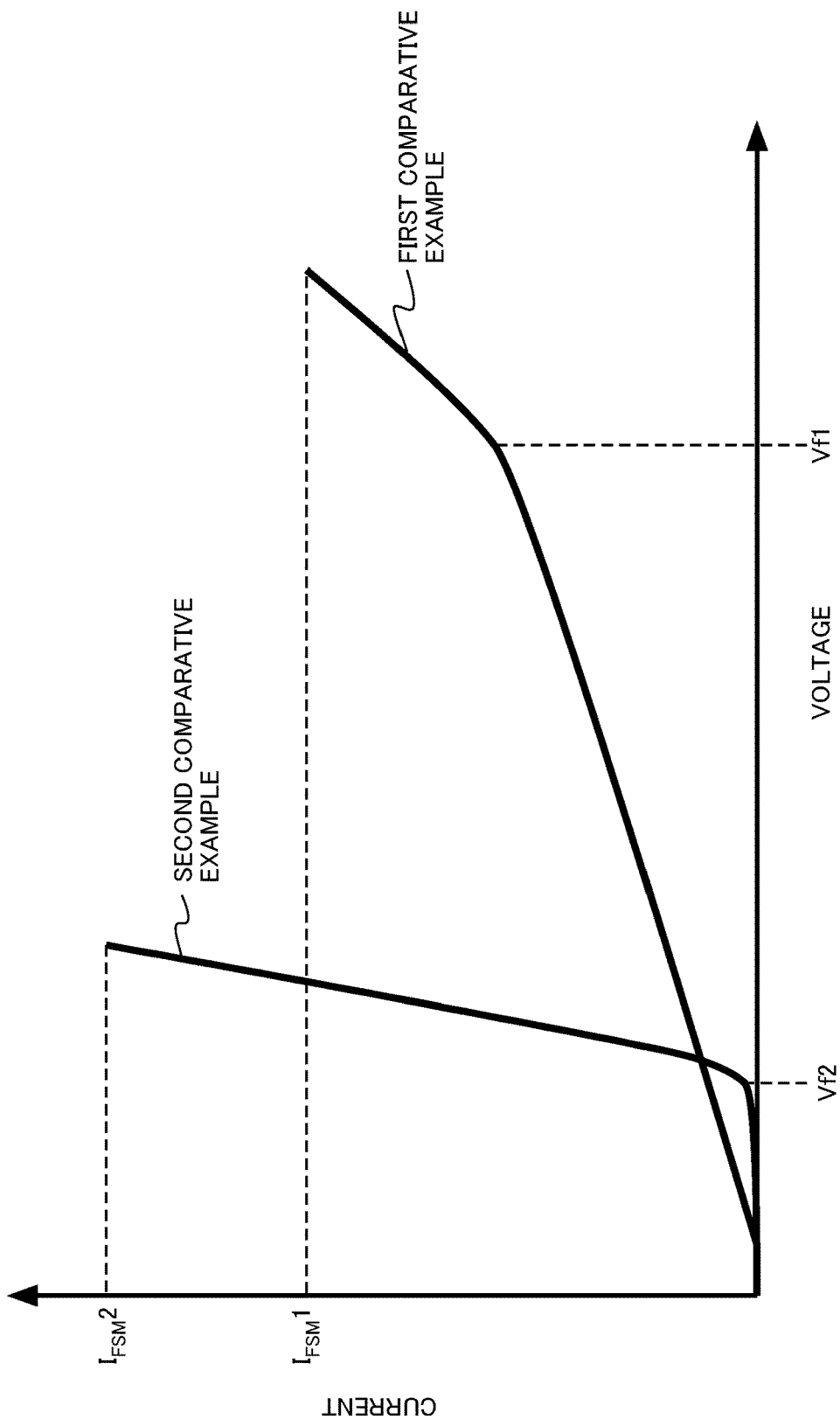
FIG. 11 is an explanatory diagram of the functions and effects of the semiconductor device of the first embodiment.

FIG. 11 is an explanatory diagram of the functions and effects of the semiconductor device of the first embodiment. FIG. 11 is a diagram illustrating voltage-current characteristics of the built-in diodes of the MOSFET of the first comparative example and the MOSFET of the second comparative example.

As illustrated in FIG. 11, in the MOSFET of the second comparative example, a voltage equal to or more than a forward voltage Vf2 of the pn junction diode is applied, and thus, a current flows through the pn junction diode. On the other hand, in the MOSFET of the first comparative example, the current flows through the SBD until a forward voltage Vf1 of the pn junction diode is applied. In the MOSFET of the first comparative example, when the voltage equal to or more than the forward voltage Vf1 of the pn junction diode is applied, the current flows through the pn junction diode.

Since the MOSFET of the first comparative example performs a unipolar operation up to the forward voltage Vf1, a slope of a current increase becomes smaller than in the MOSFET of the second comparative example. Accordingly, a maximum allowable peak current value $I_{FSM}1$ of the MOSFET of the first comparative example becomes smaller than a maximum allowable peak current value $I_{FSM}2$ of the MOSFET of the second comparative example. In other words, the surge current tolerance of the MOSFET of the first comparative example becomes smaller than a surge current tolerance of the MOSFET of the second comparative example.

The MOSFET 100 of the first embodiment includes the diode region 102 provided between the transistor regions 101. The MOSFET 100 of the first embodiment includes the diode region 102, and thus, the surge current tolerance is improved. Details will be described below.

FIGS. 12A and 12B are explanatory diagrams of the functions and effects of the semiconductor device of the first embodiment. FIGS. 12A and 12B are schematic cross-sectional views of the first embodiment. FIGS. 12A and 12B are diagrams corresponding to FIG. 4A.

FIGS. 12A and 12B are diagrams illustrating the current flowing through the built-in diode of the MOSFET of the first comparative example. FIG. 12A illustrates a state where the forward current flows only through the SBD, and FIG. 12B illustrates a state where the forward current flows through the SBD and the pn junction diode.

That is, FIG. 12A illustrates a state where the voltage applied between the pn junctions of the pn junction diodes is lower than the forward voltage (Vf) of the pn junction diode. FIG. 12B illustrates a state where the voltage applied between the pn junctions of the pn junction diodes is higher than the forward voltage (Vf) of the pn junction diode.

In FIGS. 12A and 12B, a dotted arrow indicates the current flowing through the SBD. In FIG. 12B, a solid arrow indicates a current flowing through the pn junction diode.

In the diode region 102, the second distance d2 between two second portions 28b adjacent with the p region 32 interposed therebetween is substantially equal to the first distance d1 between two first portions 28a adjacent with the body region 30 interposed therebetween in the transistor region 101. In other words, the second portions 28b are provided in the diode region 102 at the same interval as the first portions 28a of the transistor region 101. In other words, an SBD region is provided in the diode region 102 at the same interval as the transistor region 101.

Accordingly, as illustrated in FIG. 12A, in the diode region 102, the current flowing through the SBD flows around a bottom of the p region 32. Thus, at the bottom of the p region 32, the voltage hardly exceeds the forward voltage (Vf) of the pn junction diode. The forward voltage (Vf) of the pn junction diode in the diode region 102 is increased by providing the SBD region.

When the voltage applied between the pn junctions of the pn junction diodes becomes higher than the forward voltage (Vf) of the pn junction diode, a current also flows through the pn junction diode as illustrated in FIG. 12B.

In the MOSFET 100 of the first embodiment, the occupancy rate per unit area of the p region 32 projected onto the first plane P1 is larger than the occupancy rate per unit area of the body region 30 projected onto the first plane P1. That is, the occupation rate of the pn junction diode in the diode region 102 is larger than the occupation rate of the pn junction diode in the transistor region 101.

The contact area per unit area between the source electrode 12 and the p region 32 in the diode region 102 is larger than the contact area per unit area between the source electrode 12 and the body region 30 in the transistor region 101. That is, the contact resistance per unit area between the source electrode 12 and the p region 32 in the diode region 102 is smaller than the contact resistance per unit area between the source electrode 12 and the body region 30 in the transistor region 101.

Accordingly, the current flowing through the pn junction diode of the diode region 102 becomes larger than the current flowing through the pn junction diode of the transistor region 101.

The large current flows through the pn junction diode of the diode region 102, the propagation of the carriers and the propagation of the heat to the adjacent transistor region 101 occur. Accordingly, conductivity modulation of the transistor region 101 adjacent to the diode region 102 is promoted. Thus, the current flowing through the pn junction diode of the transistor region 101 adjacent to the diode region 102 becomes large.

Figure 13:
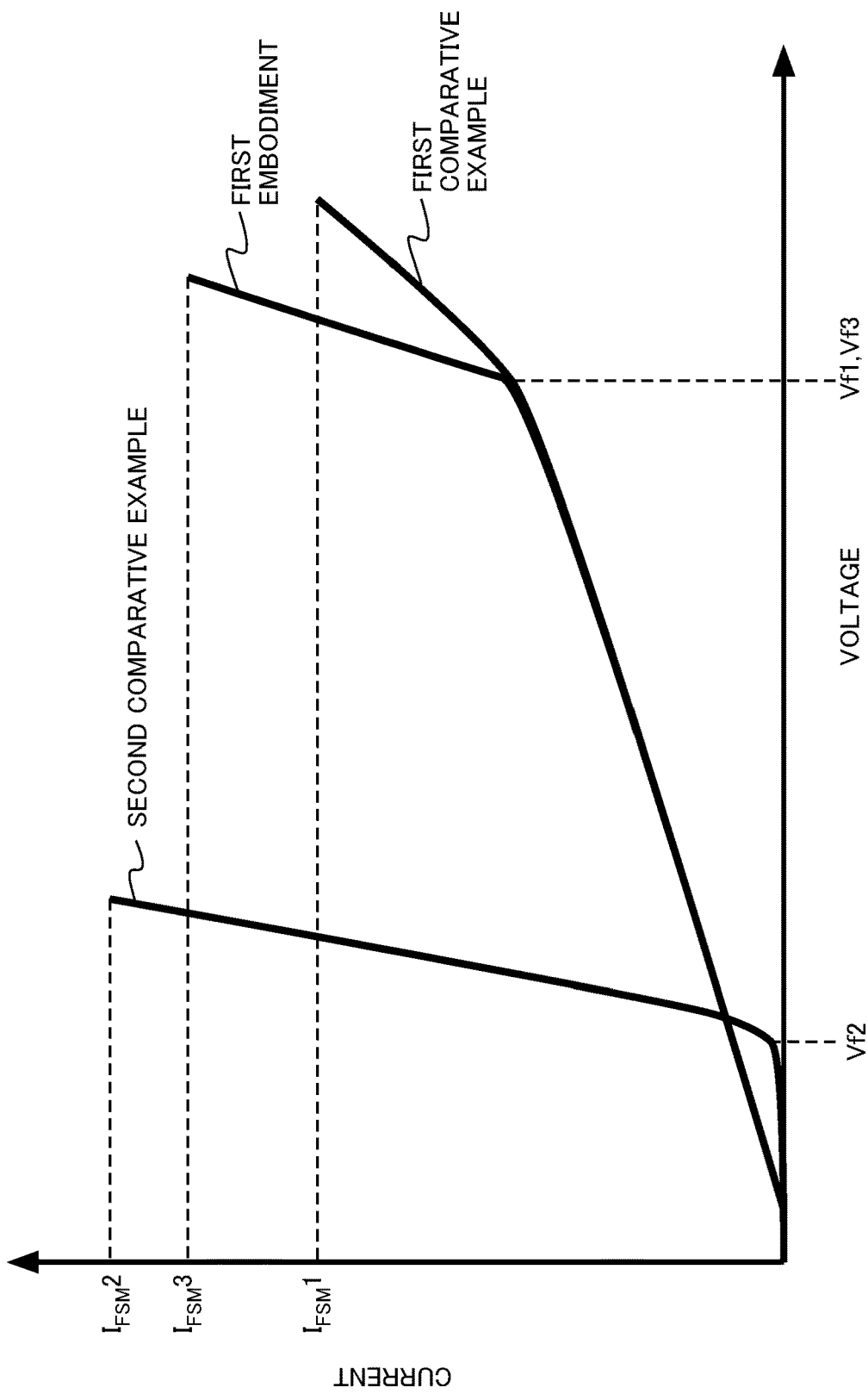
FIG. 13 is an explanatory diagram of the functions and effects of the semiconductor device of the first embodiment.

FIG. 13 is an explanatory diagram of the functions and effects of the semiconductor device of the first embodiment. FIG. 13 is a diagram illustrating voltage-current characteristics of the built-in diodes of the MOSFET of the first comparative example, the MOSFET of the second comparative example, and the MOSFET 100 of the first embodiment.

As illustrated in FIG. 13, in the MOSFET 100 of the first embodiment, a current flows through the SBD until a forward voltage Vf3 of the pn junction diode is applied. In the MOSFET 100 of the first embodiment, when a voltage equal to or more than the forward voltage Vf3 of the pn junction diode is applied, a current flows through the pn junction diode.

In the diode region 102 of the MOSFET 100 of the first embodiment, the SBD region is provided at the same interval as the transistor region 101. Accordingly, the forward voltage Vf3 of the pn junction diode of the MOSFET 100 of the first embodiment is equal to the forward voltage Vf1 of the pn junction diode of the MOSFET of the first comparative example.

On the other hand, the current after the voltage exceeds the forward voltage Vf3 of the pn junction diode in the MOSFET 100 of the first embodiment becomes larger than the current after the voltage exceeds the forward voltage Vf1 of the pn junction diode in the MOSFET of the first comparative example. This is because the current flowing through the pn junction diode of the diode region 102 and the pn junction diode of the transistor region 101 adjacent to the diode region 102 becomes larger than in the MOSFET of the first comparative example.

The current after the voltage exceeds the forward voltage Vf3 of the pn junction diode becomes large, and thus, a maximum allowable peak current value $I_{FSM}3$ of the MOSFET 100 of the first embodiment becomes larger than the maximum allowable peak current value $I_{FSM}1$ of the MOSFET of the first comparative example. In other words, the surge current tolerance of the MOSFET 100 of the first embodiment becomes larger than the surge current tolerance of the MOSFET of the first comparative example.

As described above, the MOSFET 100 of the first embodiment includes the diode region 102 provided between the transistor regions 101, and thus, the surge current tolerance is improved.

The occupancy rate per unit area of the p region 32 projected onto the first plane P1 is preferably equal to or more than 1.2 times and equal to or less than 3 times the occupancy rate per unit area of the body region 30 projected onto the first plane P1. The occupancy rate exceeds a lower limit value, and thus, the surge current tolerance is further improved. The occupancy rate is below an upper limit value, and thus, a decrease in the forward voltage Vf3 is suppressed. Accordingly, a decrease in reliability is suppressed.

As described above, according to the first embodiment, the MOSFET in which the surge current tolerance is improved is realized.

Second Embodiment

A semiconductor device of a second embodiment is different from the semiconductor device of the first embodiment in that the second distance between two second portions adjacent to each other with the fourth silicon carbide region interposed therebetween is larger than the first distance between two first portions adjacent to each other with the second silicon carbide region interposed therebetween. Hereinafter, a part of contents overlapping the contents of the first embodiment will not be described.

A MOSFET of the second embodiment has the same structure as the MOSFET 100 of the first embodiment except that the second distance d2 between two second portions 28b adjacent to each other with the p region 32 interposed therebetween is larger than the first distance d1 between two first portions 28a adjacent to each other with the body region 30 interposed therebetween. The second distance d2 is, for example, equal to or more than 1.1 times and equal to or less than 2 times the first distance d1.

As the distance d2 becomes large, the forward voltage (Vf) of the pn junction diode in the diode region 102 becomes low. Accordingly, when a large surge voltage is applied to the MOSFET of the second embodiment, the current flowing through the pn junction diode of the diode region 102 becomes larger than in the MOSFET 100 of the first embodiment. Thus, the surge current tolerance of the MOSFET is further improved.

From the viewpoint of preventing the forward voltage (Vf) of the pn junction diode in the diode region 102 from becoming too low, the second distance d2 is preferably equal to or less than twice the first distance d1.

As described above, according to the second embodiment, the MOSFET in which the surge current tolerance is further improved is realized.

Third Embodiment

A semiconductor device of a third embodiment is different from the semiconductor device of the first embodiment in that the n-type impurity concentration of the sixth silicon carbide region is lower than the n-type impurity concentration of the fifth silicon carbide region. Hereinafter, a part of contents overlapping the contents of the first embodiment will not be described.

A MOSFET of the third embodiment has the same structure as the MOSFET 100 of the first embodiment except that the n-type impurity concentration of the second bottom region 38 is lower than the n-type impurity concentration of the first bottom region 36. The n-type impurity concentration of the second bottom region 38 is, for example, equal to or less than ⅔ of the n-type impurity concentration of the first bottom region 36.

The n-type impurity concentration in the second bottom region 38 becomes low, and thus, the electrical resistance of the second bottom region 38 increases. Accordingly, the current flowing through the SBD is prevented from flowing around the bottom of the p region 32. Accordingly, the forward voltage (Vf) of the pn junction diode in the diode region 102 becomes low.

Accordingly, when a large surge voltage is applied to the MOSFET of the third embodiment, the current flowing through the pn junction diode of the diode region 102 becomes larger than in the MOSFET 100 of the first embodiment. Thus, the surge current tolerance of the MOSFET is further improved.

As described above, according to the third embodiment, the MOSFET in which the surge current tolerance is further improved is realized.

Fourth Embodiment

A semiconductor device of a fourth embodiment is different from the semiconductor device of the first embodiment in that a depth of the fourth silicon carbide region is greater than a depth of a second silicon carbide region. Hereinafter, a part of contents overlapping the contents of the first embodiment will not be described.

FIGS. 14A and 14B are schematic cross-sectional views of the semiconductor device of the fourth embodiment. FIGS. 14A and 14B are diagrams corresponding to FIGS. 4A and 4B of the first embodiment.

A MOSFET of the fourth embodiment has the same structure as the MOSFET 100 of the first embodiment except that a depth of the p region 32 of the diode region 102 is greater than a depth of the body region 30 of the transistor region 101. The depth of the p region 32 is, for example, equal to or more than 1.1 times and equal to or less than 2 times the depth of the body region 30.

The depth of the p region 32 becomes greater than the depth of the body region 30, and thus, the current flowing through the SBD is prevented from flowing around to the bottom of the p region 32. Accordingly, the forward voltage (Vf) of the pn junction diode in the diode region 102 becomes low. Accordingly, when a large surge voltage is applied to the MOSFET of the fourth embodiment, the current flowing through the pn junction diode of the diode region 102 becomes larger than in the MOSFET 100 of the first embodiment. Thus, the surge current tolerance of the MOSFET is further improved.

As described above, according to the fourth embodiment, the MOSFET in which the surge current tolerance is further improved is realized.

Fifth Embodiment

A semiconductor device of a fifth embodiment is different from the semiconductor device of the first embodiment in that the p-type impurity concentration of the fourth silicon carbide region is higher than the p-type impurity concentration of the second silicon carbide region. Hereinafter, a part of contents overlapping the contents of the first embodiment will not be described.

A MOSFET of the fifth embodiment has the same structure as the MOSFET 100 of the first embodiment except that the p-type impurity concentration of the p region 32 of the diode region 102 is higher than the p-type impurity concentration of the body region 30 of the transistor region 101. For example, the p-type impurity concentration of the p region 32 is equal to or more than 1.5 times and equal to or less than 10 times the p-type impurity concentration of the body region 30.

For example, the p-type impurity concentration of the high concentration portion 32b of the p region 32 of the diode region 102 is higher than the p-type impurity concentration of the high concentration portion 30b of the body region 30. The p-type impurity concentration of the high concentration portion 32b is, for example, equal to or more than 1.5 times and equal to or less than 10 times the p-type impurity concentration of the high concentration portion 30b.

The p-type impurity concentration of the p region 32 of the diode region 102 becomes higher than the p-type impurity concentration of the body region 30 of the transistor region 101, and thus, the contact resistance between the source electrode 12 and the p region 32 becomes lower than the contact resistance between the source electrode 12 and the body region 30. Accordingly, when a large surge voltage is applied to the MOSFET of the fifth embodiment, the current flowing through the pn junction diode of the diode region 102 further becomes larger than the current flowing through the pn junction diode of the transistor region 101.

Accordingly, when a large surge voltage is applied to the MOSFET of the fifth embodiment, the current flowing through the pn junction diode of the diode region 102 becomes larger than in the MOSFET 100 of the first embodiment. Thus, the surge current tolerance of the MOSFET is further improved.

As described above, according to the fifth embodiment, the MOSFET in which the surge current tolerance is further improved is realized.

Sixth Embodiment

A semiconductor device of a sixth embodiment is different from the semiconductor device of the first embodiment in that the first transistor region is provided between a second diode region which is one of at least one diode region and the first diode region. Hereinafter, a part of contents overlapping the contents of the first embodiment will not be described.

Figure 15B:
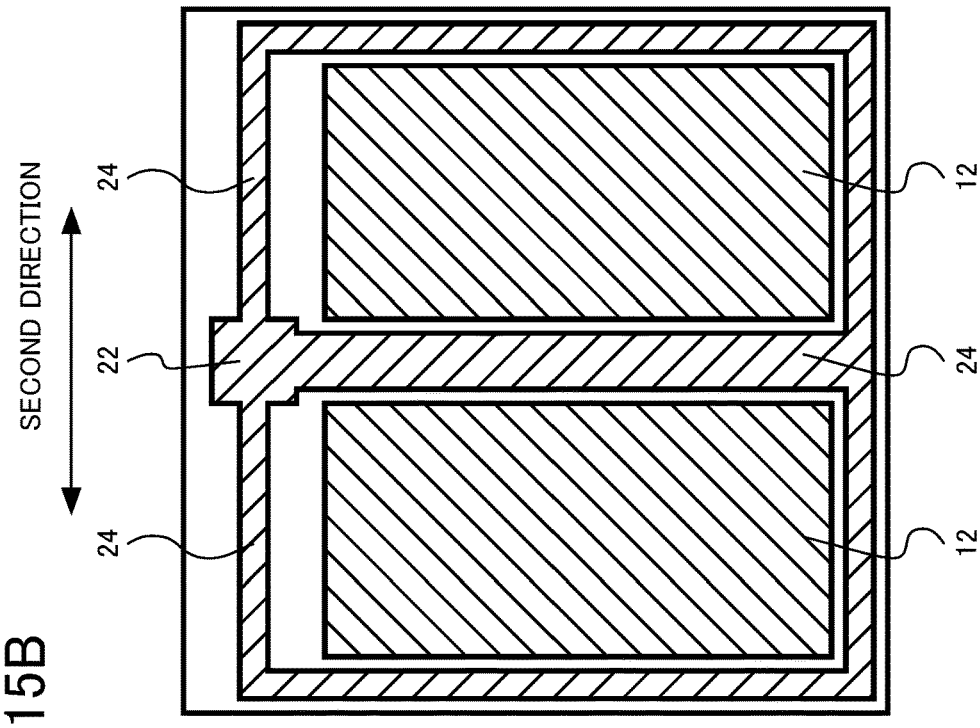
FIGS. 15A and 15B are schematic top views of a semiconductor device of a sixth embodiment.
Figure 15A:
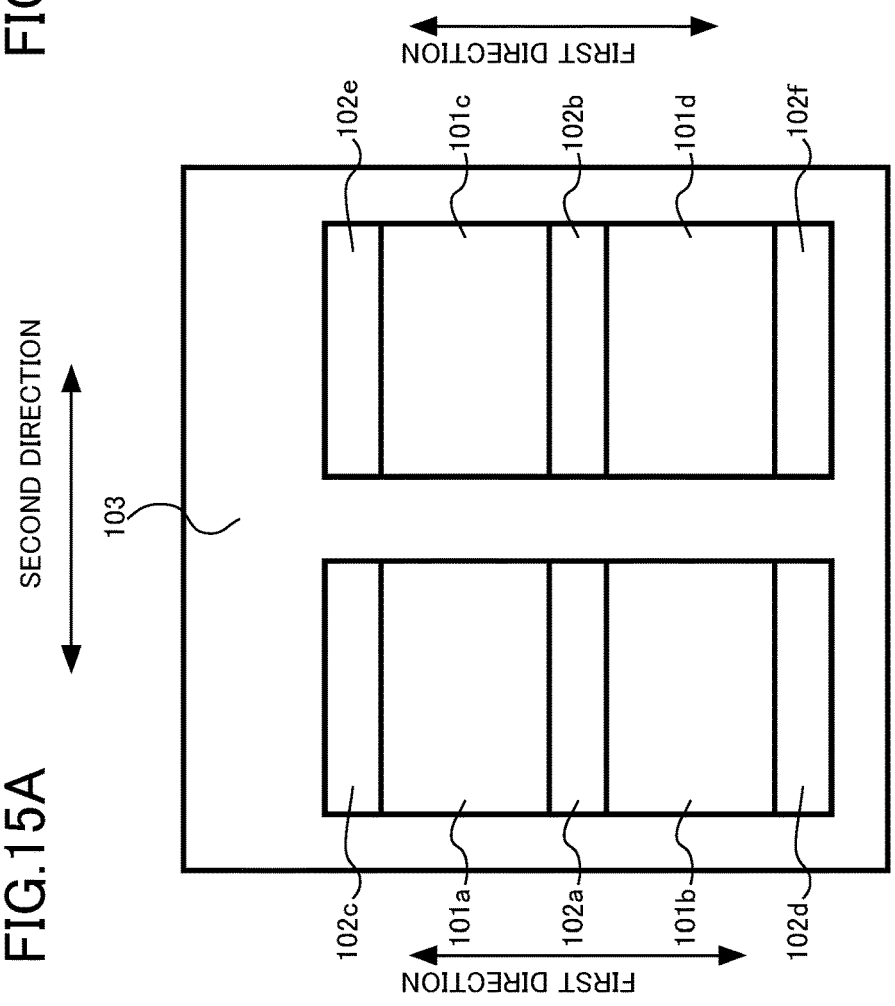

FIGS. 15A and 15B are schematic top views of the semiconductor device of the sixth embodiment. FIG. 15A is an arrangement diagram of each region included in a MOSFET of the sixth embodiment. FIG. 15B is a diagram illustrating patterns of electrodes and wirings on an upper surface of the MOSFET in the sixth embodiment. FIGS. 15A and 15B are diagrams corresponding to FIGS. 1A and 1B of the first embodiment.

As illustrated in FIG. 15A, the MOSFET of the sixth embodiment includes a transistor region 101a (first transistor region), a transistor region 101b (second transistor region), a transistor region 101c, a transistor region 101d, a diode region 102a (first diode region), a diode region 102b, a diode region 102c (second diode region), a diode region 102d, a diode region 102e, a diode region 102f, and a termination region 103. The transistor region 101a is an example of a first transistor region. The transistor region 101b is an example of a second transistor region. The diode region 102a is an example of a first diode region. The diode region 102c is an example of a second diode region.

Hereinafter, the transistor region 101a, the transistor region 101b, the transistor region 101c, and the transistor region 101d may be simply referred to as a transistor region 101 individually or collectively. The diode region 102a and the diode region 102b may be simply referred to as a diode region 102 individually or collectively.

A MOSFET and an SBD are provided in the transistor region 101. An SBD is provided in the diode region 102. A MOSFET is not provided in the diode region 102.

The diode region 102 is provided between two transistor regions 101. For example, the diode region 102a is provided between the transistor region 101a and the transistor region 101b. The transistor region 101b is provided in the first direction parallel to the first plane P1 with respect to the transistor region 101a.

The transistor region 101 is provided between two diode regions 102. For example, the transistor region 101a is provided between the diode region 102a and the diode region 102c. For example, the transistor region 101b is provided between the diode region 102a and the diode region 102d.

When a surge current flows through the MOSFET of the sixth embodiment, a heat generation amount of the diode region 102 becomes larger than a heat generation amount of the transistor region 101. In the MOSFET of the sixth embodiment, the diode region 102 is dispersedly arranged, and thus, a high-temperature region is dispersed in a chip of the MOSFET. Accordingly, breakdown due to heat generation of the MOSFET is suppressed.

In the MOSFET of the sixth embodiment, the diode regions 102 are provided on both sides of the transistor region 101. Accordingly, the propagation of the carriers and the propagation of the heat from the diode region 102 to the transistor region 101 are promoted. Thus, the current flowing through the pn junction diode of the transistor region 101 adjacent to the diode region 102 becomes large, and the surge current tolerance is further improved.

As described above, according to the sixth embodiment, the MOSFET in which the surge current tolerance is further improved is realized.

Seventh Embodiment

A semiconductor device of a seventh embodiment is different from the semiconductor device of the first embodiment in that a third diode region which is one of at least one diode region is provided between the first transistor region and a third transistor region which is one of a plurality of transistor regions provided in the second direction parallel to the first plane and orthogonal to the first direction with respect to the first transistor region. Hereinafter, a part of contents overlapping the contents of the first embodiment will not be described.

Figure 16B:
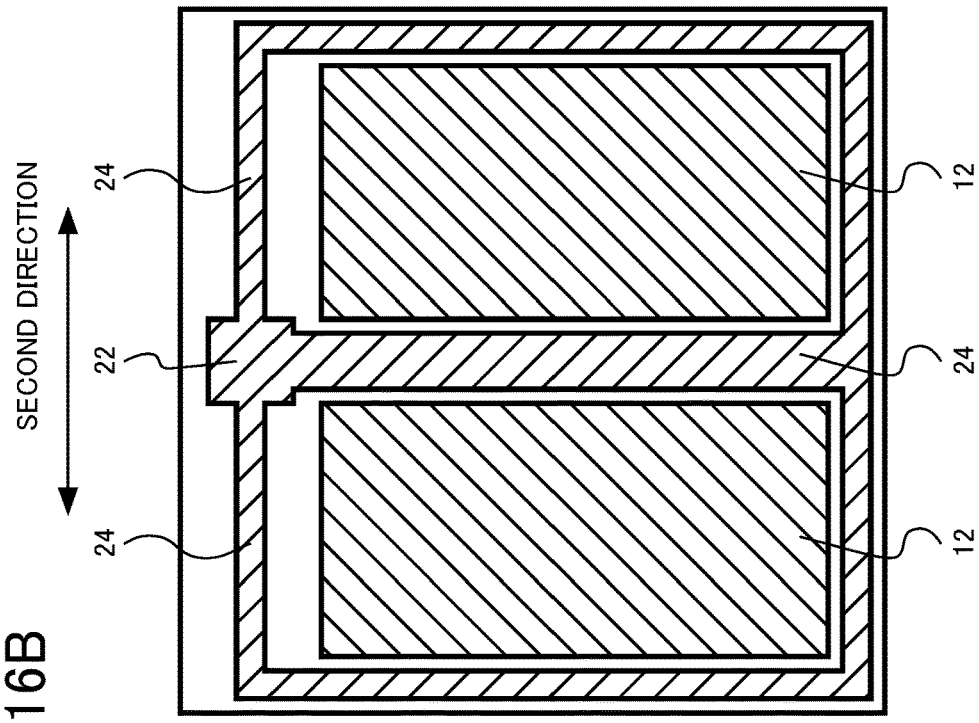
FIGS. 16A and 16B are schematic top views of a semiconductor device of a seventh embodiment.
Figure 16A:
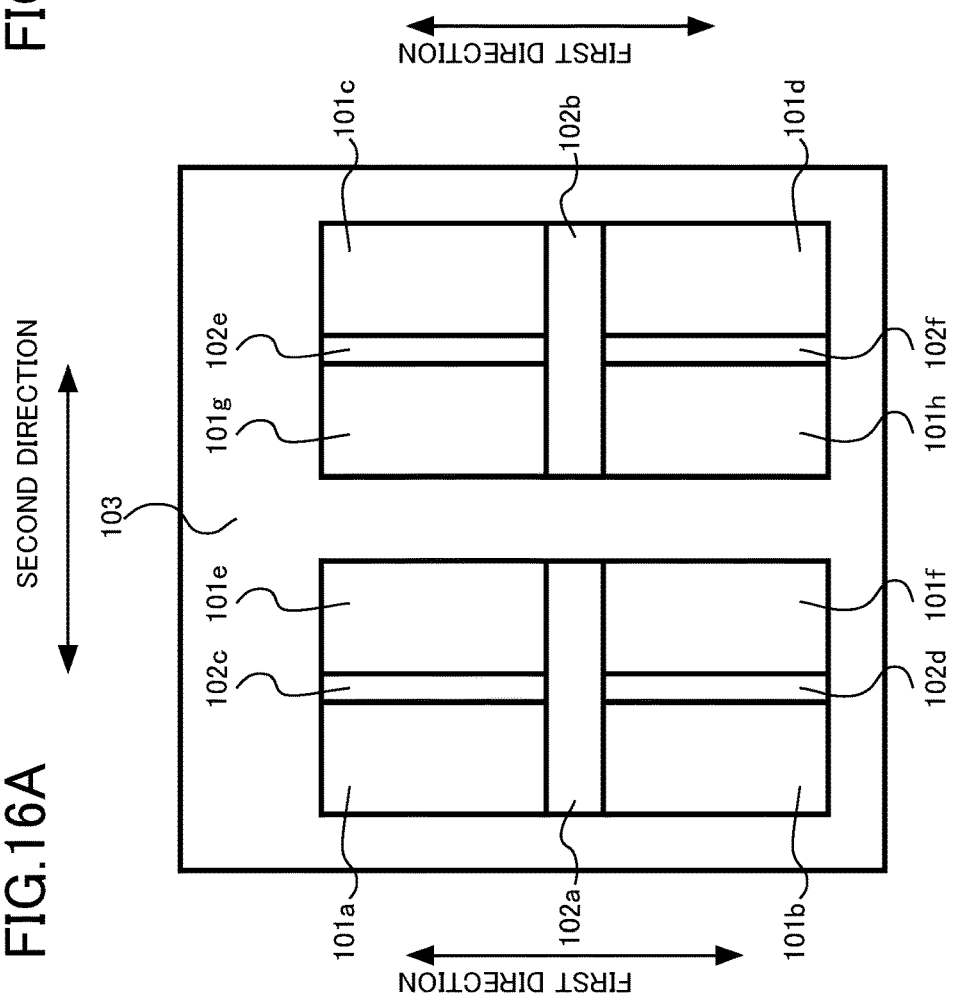

FIGS. 16A and 16B are schematic top views of the semiconductor device of the seventh embodiment. FIG. 16A is an arrangement diagram of each region included in a MOSFET of the seventh embodiment. FIG. 16B is a diagram illustrating patterns of electrodes and wirings on an upper surface of the MOSFET in the seventh embodiment. FIGS. 16A and 16B are diagrams corresponding to FIGS. 1A and 1B of the first embodiment.

As illustrated in FIG. 16A, the MOSFET of the seventh embodiment includes a transistor region 101a (first transistor region), a transistor region 101b (second transistor region), a transistor region 101c, a transistor region 101d, a transistor region 101e (third transistor region), a transistor region 101g, a transistor region 101g, a transistor region 101h, a diode region 102a (first diode region), a diode region 102b, a diode region 102c (third diode region), a diode region 102d, a diode region 102e, a diode region 102f, and a termination region 103. The transistor region 101a is an example of a first transistor region. The transistor region 101e is an example of a third transistor region. The diode region 102a is an example of a first diode region. The diode region 102c is an example of a third diode region.

Hereinafter, the transistor region 101a, the transistor region 101b, the transistor region 101c, and the transistor region 101d may be simply referred to as a transistor region 101 individually or collectively. The diode region 102a and the diode region 102b may be simply referred to as a diode region 102 individually or collectively.

A MOSFET and an SBD are provided in the transistor region 101. An SBD is provided in the diode region 102. A MOSFET is not provided in the diode region 102.

The diode region 102 is provided between two transistor regions 101. For example, the diode region 102a is provided between the transistor region 101a and the transistor region 101b. The transistor region 101b is provided in the first direction parallel to the first plane P1 with respect to the transistor region 101a. The diode region 102a extends in the second direction.

For example, the diode region 102c is provided between the transistor region 101a and the transistor region 101e. The transistor region 101e is provided in the second direction parallel to the first plane P1 and orthogonal to the first direction with respect to the transistor region 101a. The diode region 102c extends in the first direction. The diode region 102c is in contact with the diode region 102a.

When a surge current flows through the MOSFET of the seventh embodiment, a heat generation amount of the diode region 102 becomes larger than a heat generation amount of the transistor region 101. In the MOSFET of the seventh embodiment, the diode region 102 is dispersedly arranged, and thus, a high-temperature region of the MOSFET is dispersed. Accordingly, breakdown due to heat generation of the MOSFET is suppressed.

In the MOSFET of the seventh embodiment, the diode region 102 is provided adjacent to the transistor region 101 in the first direction and the second direction. Accordingly, the propagation of the carriers and the propagation of the heat from the diode region 102 to the transistor region 101 are promoted. Thus, the current flowing through the pn junction diode of the transistor region 101 adjacent to the diode region 102 becomes large, and the surge current tolerance is further improved.

In the MOSFET of the seventh embodiment, the diode region 102 extending in the first direction and the diode region 102 extending in the second direction are in contact with each other. Accordingly, the propagation of the carriers and the propagation of the heat from the diode region 102 to the transistor region 101 are further promoted. Thus, the current flowing through the pn junction diode of the transistor region 101 adjacent to the diode region 102 becomes large, and the surge current tolerance is further improved.

MODIFICATION EXAMPLE

A semiconductor device of a modification example of the seventh embodiment is different from the semiconductor device of the seventh embodiment in that a part of the diode region extends in a direction oblique to the first direction and the second direction.

Figure 17B:
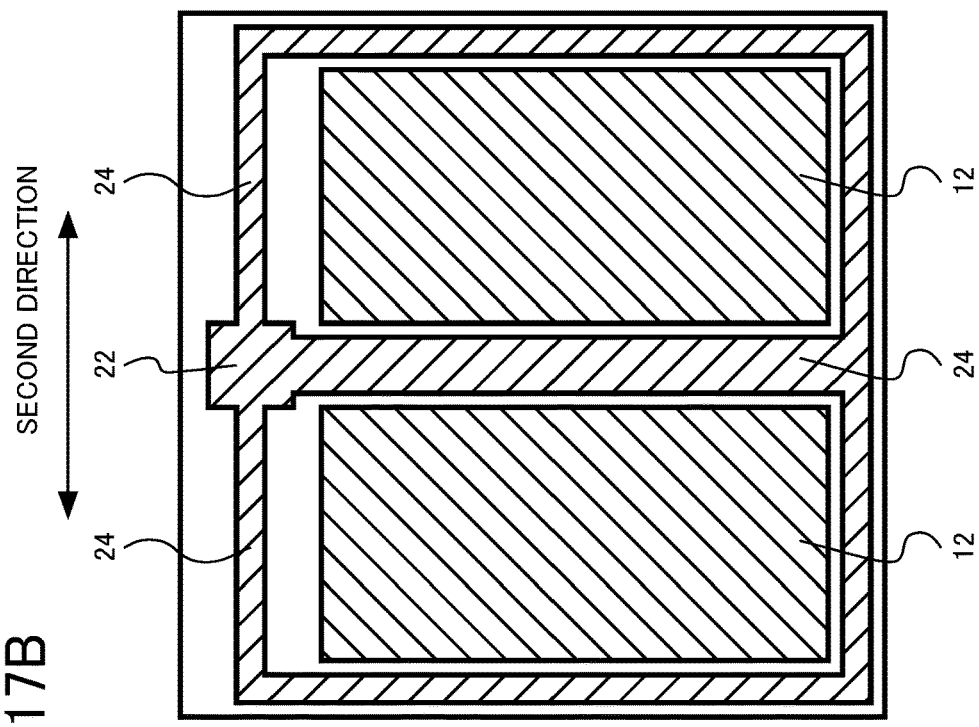
FIGS. 17A and 17B are schematic top views of a semiconductor device of a modification example of the seventh embodiment.
Figure 17A:
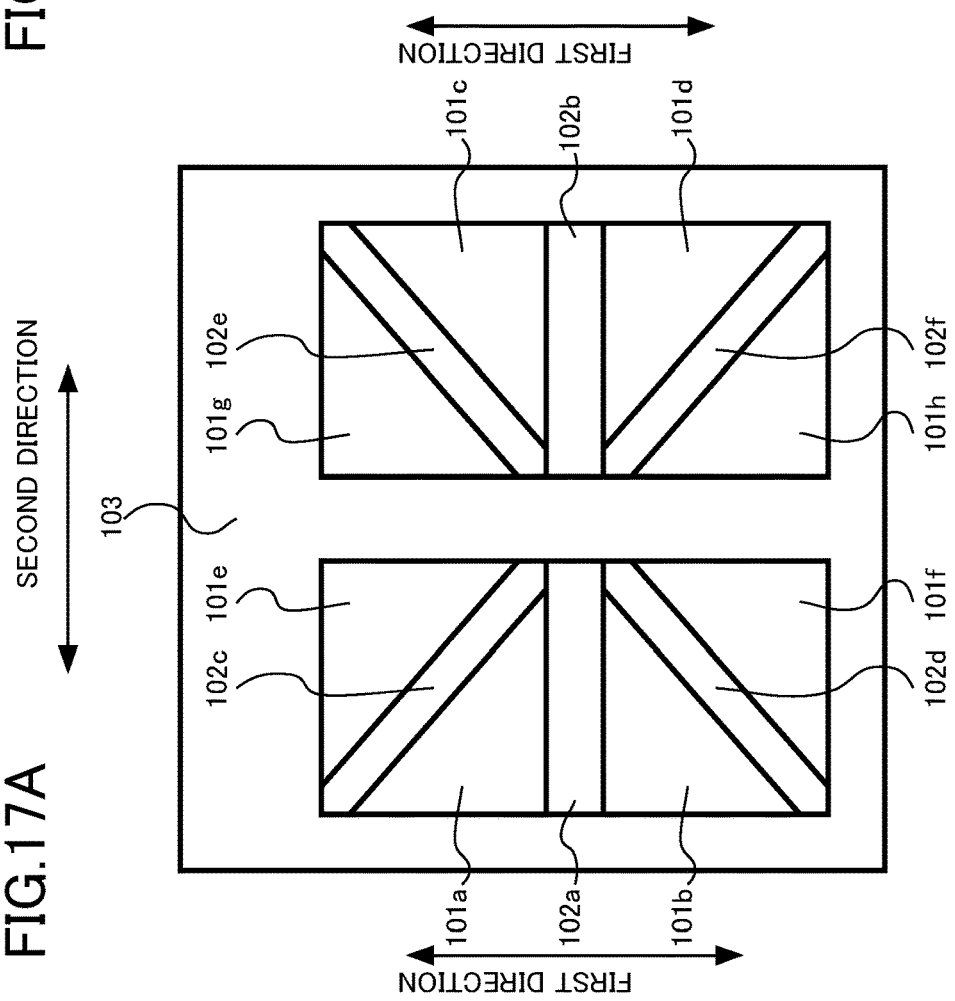

FIGS. 17A and 17B are schematic top views of the modification example of the semiconductor device of the seventh embodiment. FIG. 17A is an arrangement diagram of each region included in a MOSFET of the modification example of the seventh embodiment. FIG. 17B is a diagram illustrating patterns of electrodes and wirings on an upper surface of the MOSFET of the modification example of the seventh embodiment. FIGS. 17A and 17B are diagrams corresponding to FIGS. 16A and 16B of the seventh embodiment.

In the MOSFET of the modification example of the seventh embodiment, a part of the diode region 102 extends in the direction oblique to the first direction and the second direction. For example, the diode region 102c (third diode region), the diode region 102d, the diode region 102e, and the diode region 102f extend in the direction oblique to the first direction and the second direction.

As described above, according to the seventh embodiment and the modification example thereof, the MOSFET in which the surge current tolerance is further improved is realized.

Eighth Embodiment

An inverter circuit and a drive device of an eighth embodiment are an inverter circuit and a drive device including the semiconductor device of the first embodiment.

Figure 18:
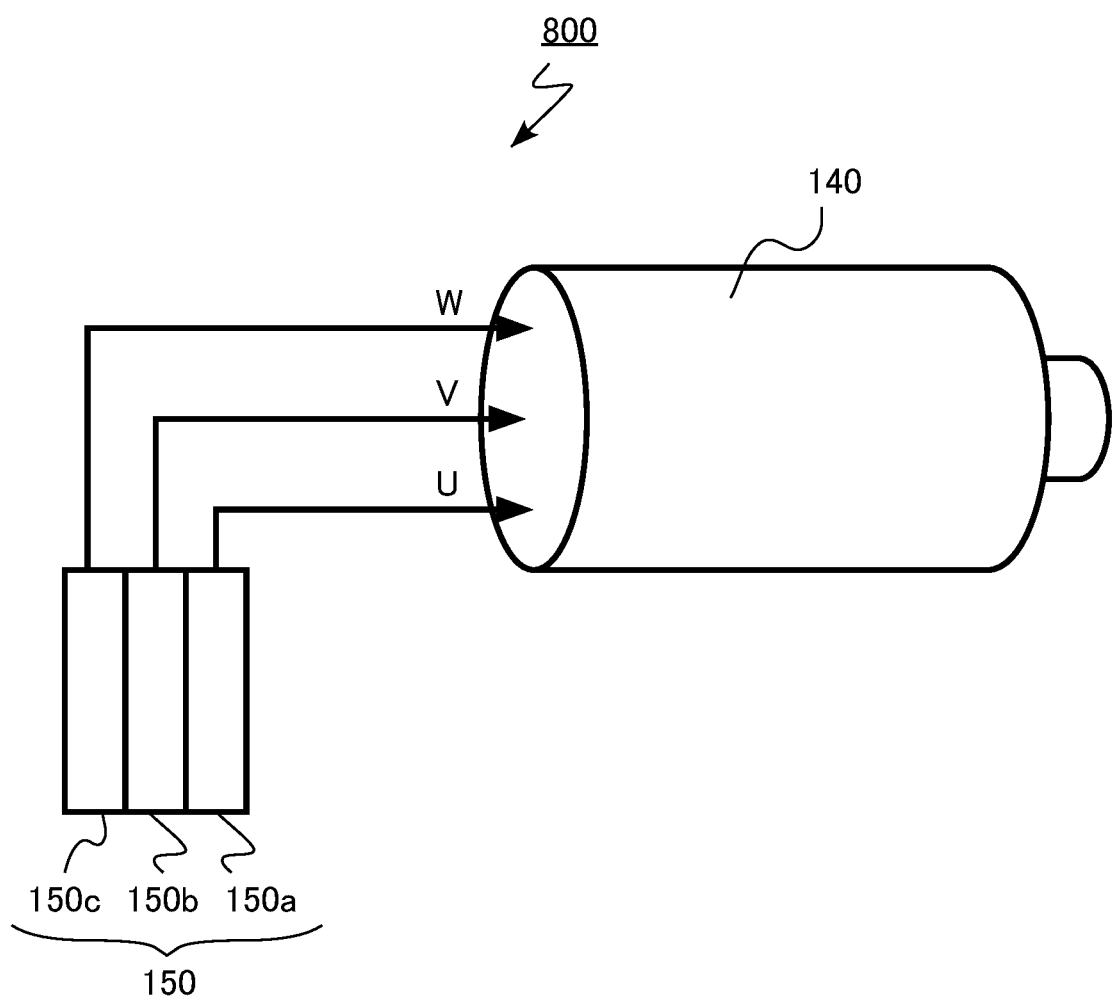
FIG. 18 is a schematic diagram of a drive device of an eighth embodiment.

FIG. 18 is a schematic diagram of the drive device of the eighth embodiment. A drive device 800 includes a motor 140 and an inverter circuit 150.

The inverter circuit 150 includes three semiconductor modules 150a, 150b, and 150c each using the MOSFET 100 of the first embodiment as a switching element. Three semiconductor modules 150a, 150b, and 150c are connected in parallel, and thus, a three-phase inverter circuit 150 including three AC voltage output terminals U, V, and W is realized. The motor 140 is driven by an AC voltage output from the inverter circuit 150.

According to the eighth embodiment, the MOSFET 100 having improved characteristics is included, and thus, characteristics of the inverter circuit 150 and the drive device 800 are improved.

Ninth Embodiment

A vehicle of a ninth embodiment is a vehicle including the semiconductor device of the first embodiment.

Figure 19:
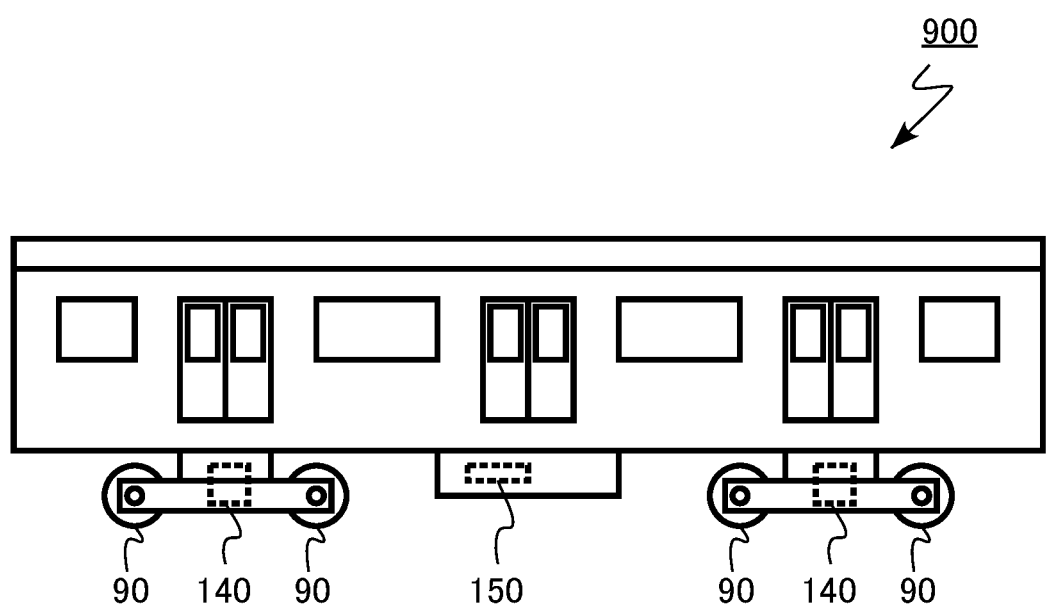
FIG. 19 is a schematic diagram of a vehicle of a ninth embodiment.

FIG. 19 is a schematic diagram of the vehicle of the ninth embodiment. A vehicle 900 of the ninth embodiment is a railway vehicle. The vehicle 900 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized. The motor 140 is driven by an AC voltage output from the inverter circuit 150. Wheels 90 of the vehicle 900 are rotated by the motor 140.

According to the ninth embodiment, the MOSFET 100 having improved characteristics is included, and thus, characteristics of the vehicle 900 are improved.

Tenth Embodiment

A vehicle of a tenth embodiment is a vehicle including the semiconductor device of the first embodiment.

Figure 20:
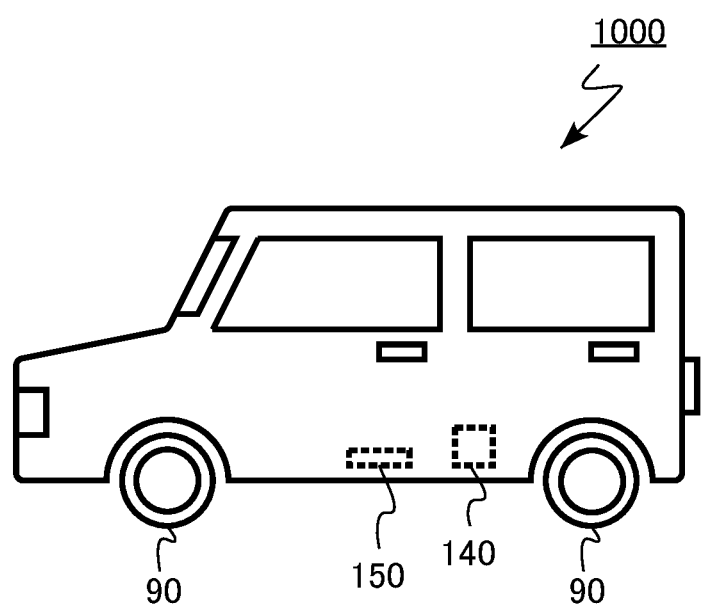
FIG. 20 is a schematic diagram of a vehicle of a tenth embodiment.

FIG. 20 is a schematic diagram of the vehicle of the tenth embodiment. A vehicle 1000 of the tenth embodiment is an automobile. The vehicle 1000 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. Wheels 90 of the vehicle 1000 are rotated by the motor 140.

According to the tenth embodiment, the MOSFET 100 having improved characteristics is included, and thus, characteristics of the vehicle 1000 are improved.

Eleventh Embodiment

An elevator of an eleventh embodiment is an elevator including the semiconductor device of the first embodiment.

Figure 21:
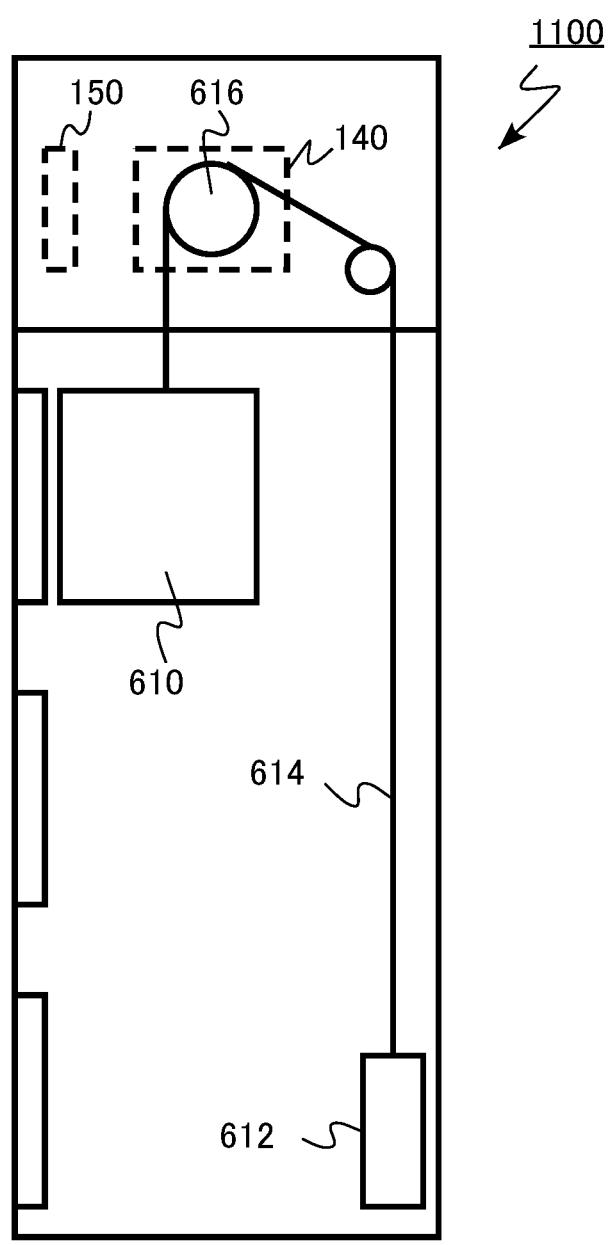
FIG. 21 is a schematic diagram of an elevator of an eleventh embodiment.

FIG. 21 is a schematic diagram of the elevator of the eleventh embodiment. An elevator 1100 of the eleventh embodiment includes a car 610, a counterweight 612, a wire rope 614, a hoist 616, a motor 140, and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. The hoist 616 is rotated by the motor 140, and thus, the car 610 moves up.

According to the eleventh embodiment, the MOSFET 100 having improved characteristics is included, and thus, characteristics of the elevator 1100 are improved.

Although it has been described in the first to seventh embodiments that 4H—SiC is used as a crystal structure of the SiC, the present disclosure can be applied to SiC having other crystal structures such as 6H—SiC and 3C—SiC. It is also possible to apply a plane other than the (0001) plane to the front surface of the silicon carbide layer 10.

In the first to seventh embodiments, it has been described that the gate electrode 18 has a so-called stripe shape, but the shape of the gate electrode 18 is not limited to the stripe shape. For example, the shape of the gate electrode 18 may be a lattice shape.

In the first to seventh embodiments, although it has been described that aluminum (Al) is used as the p-type impurity, boron (B) can also be used. Although it has been described that nitrogen (N) and phosphorus (P) are used as the n-type impurity, arsenic (As), antimony (Sb), and the like can also be applied.

In the eighth to eleventh embodiments, although it has been described that the MOSFET 100 of the first embodiment is included, the MOSFETs of the second to seventh embodiments can also be applied.

Although it has been described in the eighth to eleventh embodiments that the semiconductor device of the present disclosure is applied to the vehicle or the elevator, the semiconductor device of the present disclosure can be applied to, for example, a power conditioner of a solar power generation system.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a plurality of transistor regions; and
   at least one diode region,
   wherein
   the transistor regions include
      a silicon carbide layer having a first plane and a second plane facing the first plane, the silicon carbide layer including an n-type first silicon carbide region having a plurality of first portions in contact with the first plane, a p-type second silicon carbide region provided between the first silicon carbide region and the first plane, and an n-type third silicon carbide region provided between the second silicon carbide region and the first plane,
      a first electrode in contact with the first portions, the second silicon carbide region, and the third silicon carbide region,
      a second electrode in contact with the second plane,
      a gate electrode facing the second silicon carbide region, and
      a gate insulating layer provided between the gate electrode and the second silicon carbide region,
   the at least one diode region includes
      the silicon carbide layer including the n-type first silicon carbide region having a plurality of second portions in contact with the first plane and a p-type fourth silicon carbide region provided between the first silicon carbide region and the first plane,
      the first electrode in contact with the second portions and the fourth silicon carbide region, and
      the second electrode,
   an occupied area per unit area of the fourth silicon carbide region projected onto the first plane is larger than an occupied area per unit area of the second silicon carbide region projected onto the first plane, and
   a first diode region which is one of the at least one diode region is provided between a first transistor region which is one of the plurality of transistor regions and a second transistor region which is one of the plurality of transistor regions provided in a first direction parallel to the first plane with respect to the first transistor region.

2. The semiconductor device according to claim 1, wherein a contact area per unit area between the first electrode and the fourth silicon carbide region is larger than a contact area per unit area between the first electrode and the second silicon carbide region.

3. The semiconductor device according to claim 1, wherein a second distance between two second portions of the plurality of second portions adjacent to each other with the fourth silicon carbide region interposed therebetween is substantially equal to a first distance between two first portions of the plurality of first portions adjacent to each other with the second silicon carbide region interposed therebetween.

4. The semiconductor device according to claim 1, wherein a second distance between two second portions adjacent to each other with the fourth silicon carbide region interposed therebetween is larger than a first distance between two first portions adjacent to each other with the second silicon carbide region interposed therebetween.

5. The semiconductor device according to claim 4, wherein the second distance is equal to or less than two times the first distance.

6. The semiconductor device according to claim 1, wherein the silicon carbide layer further includes a fifth silicon carbide region provided between the first silicon carbide region and the second silicon carbide region and has an n-type impurity concentration higher than an n-type impurity concentration of the first silicon carbide region, and a sixth silicon carbide region provided between the first silicon carbide region and the fourth silicon carbide region and has an n-type impurity concentration higher than an n-type impurity concentration of the first silicon carbide region.

7. The semiconductor device according to claim 6, wherein the n-type impurity concentration of the sixth silicon carbide region is lower than the n-type impurity concentration of the fifth silicon carbide region.

8. The semiconductor device according to claim 1, wherein a depth of the fourth silicon carbide region is greater than a depth of the second silicon carbide region.

9. The semiconductor device according to claim 1, wherein a p-type impurity concentration of the fourth silicon carbide region is higher than a p-type impurity concentration of the second silicon carbide region.

10. The semiconductor device according to claim 1, wherein the gate electrode extends in a second direction parallel to the first plane and orthogonal to the first direction.

11. The semiconductor device according to claim 1, wherein the first transistor region is provided between a second diode region which is one of the at least one diode region and the first diode region.

12. The semiconductor device according to claim 1, wherein a third diode region which is one of the at least one diode region is provided between the first transistor region and a third transistor region which is one of the plurality of transistor regions provided in a second direction parallel to the first plane and orthogonal to the first direction with respect to the first transistor region.

13. The semiconductor device according to claim 1, wherein a width of the first diode region in the first direction is equal to or more than 30 μm.

14. An inverter circuit comprising the semiconductor device according to claim 1.

15. A drive device comprising the semiconductor device according to claim 1.

16. A vehicle comprising the semiconductor device according to claim 1.

17. An elevator comprising the semiconductor device according to claim 1.

* * * * *